United States Patent [19]
Burgers et al.

[11] Patent Number: 5,966,023
[45] Date of Patent: Oct. 12, 1999

[54] RAPID ACTION ENGAGEMENT INTERFACE CONNECTION SYSTEM

[75] Inventors: Henri T. Burgers, Grottoes; Jeffery P. Stowers, Mt. Sydney; Randall Clark Garman, Waynesboro, all of Va.

[73] Assignee: Virginia Panel Corporation, Waynesboro, Va.

[21] Appl. No.: 08/714,709

[22] Filed: Sep. 16, 1996

[51] Int. Cl.⁶ .................... G01R 1/073; H01R 13/703
[52] U.S. Cl. ............................. 324/761; 439/341
[58] Field of Search .................... 324/754, 761, 324/158.1, 255; 439/341, 374, 376, 901, 902, 903, 607

[56] References Cited

U.S. PATENT DOCUMENTS

| | | | |
|---|---|---|---|
| 2,899,669 | 5/1959 | Johanson | 439/341 |
| 3,590,377 | 6/1971 | Sorger | 324/754 |
| 3,969,796 | 7/1976 | Hodsdon et al. | 439/341 |
| 4,257,665 | 3/1981 | John et al. | 439/341 |
| 4,329,005 | 5/1982 | Braginetz et al. | 439/51 |
| 4,560,216 | 12/1985 | Egawa | 439/68 |
| 4,644,269 | 2/1987 | Golder et al. | 324/755 |
| 4,667,155 | 5/1987 | Coiner et al. | 324/754 |
| 4,738,632 | 4/1988 | Schmidt et al. | 439/341 |
| 4,812,754 | 3/1989 | Tracy et al. | 324/754 |
| 4,869,681 | 9/1989 | Vache et al. | 439/341 |
| 4,922,191 | 5/1990 | Conover | 324/755 |
| 5,000,689 | 3/1991 | Ishizuka et al. | 439/341 |
| 5,011,423 | 4/1991 | Reuter | 439/341 |
| 5,086,269 | 2/1992 | Nobi | 324/760 |
| 5,103,378 | 4/1992 | Stowers et al. | 439/64 |
| 5,123,850 | 6/1992 | Elder et al. | 324/158.1 |
| 5,176,525 | 1/1993 | Nierescher et al. | 324/755 |
| 5,302,891 | 4/1994 | Wood et al. | 324/765 |
| 5,414,372 | 5/1995 | Levy | 324/765 |
| 5,436,567 | 7/1995 | Wexler et al. | 324/761 |

OTHER PUBLICATIONS

*AMP Engineering and Purchasing Guide,* 1966, 1971, and 1976 by AMP Incorporated, Harrisburg, PA, prior to Sep. 16, 1996.
Brochure 889131, Issued Apr. 1997, by AMP Incorporated.
MacPanel RFI Series 60, High Point, NC, prior to Sep. 16, 1996.

*Primary Examiner*—Ernest Karlsen
*Attorney, Agent, or Firm*—Irah H. Donner; Pepper Hamilton LLP

[57] ABSTRACT

A rapid action engagement interface connection system includes a receiver electrically connected to the device under test and including at least one receiver electrical connector. The receiver includes a receiver main body section accommodating the at least one receiver electrical connector. The receiver includes a pivot tab, connected to, or integral with, the lower receiver section of the receiver main body section, first and second guides, connected to, or integral with, the first and second receiver sides, and a locking latch mechanism disposed on the upper receiver section of the receiver main body section. The rapid action engagement interface connection system also includes an interchangeable test adaptor including at least one test electrical connector. The interchangeable test adaptor includes a test main body section accommodating at least one test electrical connector, and a pivot tab receiver, connected to, or integral with, the lower test section of the test main body section. The interchangeable test adaptor includes first and second guide receivers, connected to, or integral with, the first and second test sides, and a locking latch receiver disposed on the upper test section of the test main body section.

32 Claims, 19 Drawing Sheets

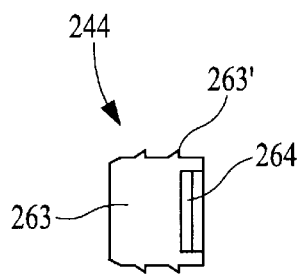
FIG. 15
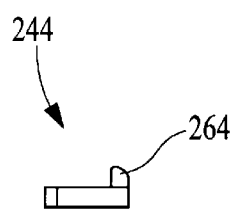
FIG. 16
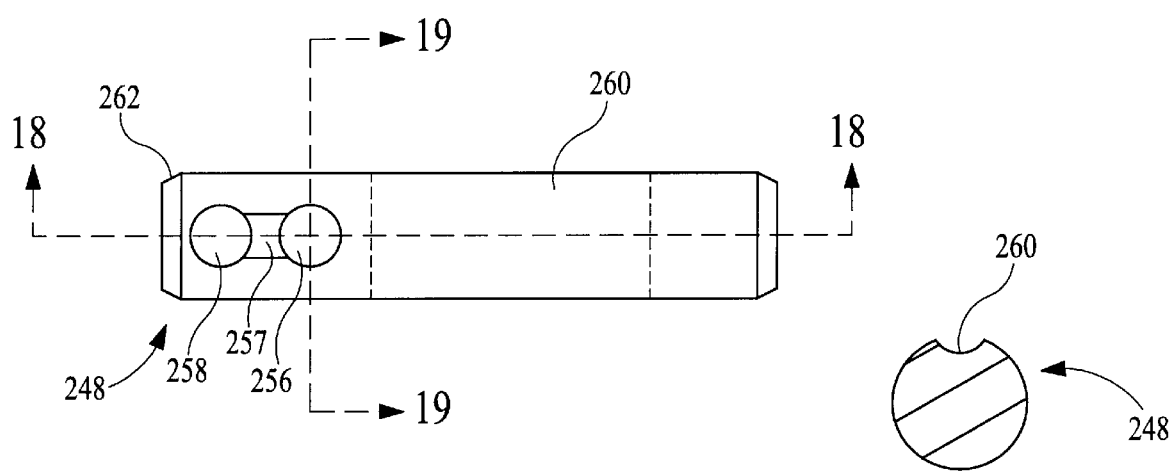
FIG. 17
FIG. 18
FIG. 19
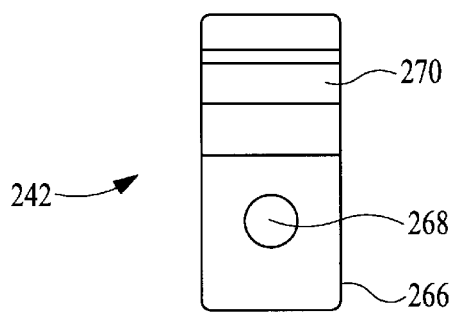
FIG. 20
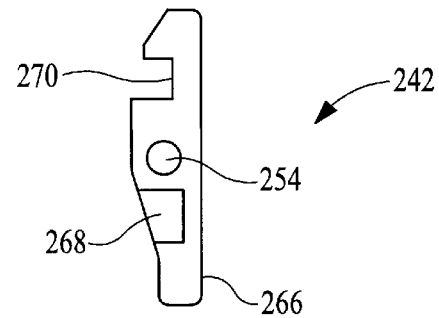
FIG. 21

RAPID ACTION ENGAGEMENT INTERFACE CONNECTION SYSTEM

RELATED APPLICATIONS

This application is related to the following copending patent applications: patent application Ser. No. 07/848,894, filed Mar. 10, 1992, now U.S. Pat. No. 5,227,718, patent application Ser. No. 08/049,395, filed Apr. 21, 1993, now U.S. Pat. No. 5,420,519, copending patent application Ser. No. 08/320,514, filed Oct. 11, 1994, now U.S. Pat. No. 05,576,631, copending patent application Ser. No. 08/344,575, filed Nov. 18, 1994, now U.S. Pat. No. 5,633,597, and copending patent application Ser. No. 08/643,917, filed May 7, 1996, pending, all of which are hereby incorporated by reference.

TECHNICAL FIELD

The invention relates broadly to an interface connection system, and more particularly to a rapid action engagement interface connection system. Such computer interface equipment requires the frequent placement of interchangeable test adaptors (ITA) or wiring modules with multiple minute electrical contacts in operative engagement with opposite co-acting electrical contacts of, for example, receiver modules. It is imperative that the receiver contacts and interchangeable test adaptor/wiring contacts engage with precision to minimize wear and to prevent damaging the delicate and expensive equipment.

BACKGROUND ART

Testing, diagnosis, maintenance and calibration of electronic devices often require supplying test signals to, and receiving signals from, components of a Device Under Test (DUT) or Unit Under Test (UUT). When an electronic device is fabricated on one or more circuit boards, electronic components mounted on the circuit boards may not be accessible for testing using existing circuit board mounted connectors. Therefore, connections to components to be tested are made using external electrical probes applied to the exposed leads of the components and/or to a printed circuit board wiring layer.

Automatic testing of electrical circuits requires simultaneous connection to many circuit test points. The automatic testing equipment simultaneously supplies signals to, and receives signals from, combinations of test points. A typical test fixture used to electrically probe a circuit card of a DUT includes a "bed of nails" having a platform for supporting the circuit card and an array of single headed spring probes. Each spring probe includes a probe head which makes positive electrical contact with an overlying portion of the circuit board being tested. An opposite end of each probe is connected to test equipment through single point wiring.

Since testing equipment and other electronic equipment must typically be adapted to varied uses, it is often necessary to reconfigure signal connections and condition signals to interface the equipment to a particular DUT. This can be accomplished by dedicated wiring, patch panels, and/or using appropriate signal routing/conditioning interface equipment in the form of a personality board.

A personality board is connected between a testing device and a DUT to properly route and condition signals between the two devices. Thus, a testing device is electrically adapted to a particular DUT by using an appropriate personality board. Substitution of personality boards allows a single testing device to be used with a plurality of DUTs.

The testing device is connected to a personality board which, in turn, is connected to a test fixture holding the DUT using conventional electrical connectors and cabling. Thus, the personality board is used to electrically connect two devices. However, the additional wiring used to connect the personality board can impair signal connectivity and degrade the transmitted signals.

The added connectors and cables also increase device cost and require additional mounting space on each circuit board and between circuit boards. Further, the device connectors are subject to misalignment and introduce maintenance and reliability problems. Multiple connectors and cabling also complicate the substitution of personality boards.

U.S. Pat. Nos. 5,414,372 to Levy, 5,302,891 to Wood et al., and 5,123,850 to Elder et al. all describe devices for burn-in and testing integrated circuits. Each of these patents describes securing electrical contacts via clamps. These patents do not, however, relate to or address the issue of repeatedly and reliably engaging multiple electrical contacts housed in a receiver module having top and bottom frames that is engaged with an interchangeable test adaptor.

For example, U.S. Pat. No. 5,123,850 to Elder et al. discloses a burn-in test socket which serves as a temporary package for an integrated circuit die, a multi-chip hybrid or a complete wafer (FIG. 1). A test socket base 10 has a plurality of pin sockets therein. Socket base 10 is connected to a test system (not illustrated) used to test the device mounted in the test fixture. Pin Grid Array (PGA) 12 has a plurality of pins 13 mounted therein which correspond to the pin sockets 11 in base 10. PGA 12 also has a plurality of bond pads 14, one for each pin 13. PGA 12 also has an opening 15 in the center thereof for use in aligning a semiconductor device in the test fixture.

Thin film probe 17 has a base 17a with a thin film 20 of, for example, polyamide thereon covering one side of the base 17a. A plurality of wire bond pads 18 are formed on the polyamide film 20 and are adjacent to the bond pads 14 on socket 12, as hereinafter described. Wire bond pads 18 are connected to contact bumps 24 through the thin film by signal lines 19. A transparent backing plate 16 is mounted behind the base 17a. Heat sink 22 has a plurality of fingers 23 on the top thereof to help dissipate heat from semiconductor die 21, which is mounted in cavity 30 in the heat sink. When heat sink 22 and probe head 17 are brought into contact with each other, the cavity 30 holds semiconductor die 21 in place, and the test pads thereon (not illustrated) contact the bumps 24 on probe head 17.

U.S. Pat. No. 4,922,191 to Conover describes an interconnection assembly that connects a unit under test to a testing device (FIG. 2). Latches on opposite ends of a card cage frame releasably couples the units together. The test unit includes a card cage in which a plurality of parallel, spaced circuit cards or printed wiring boards 34 are mounted. The circuit cards contain appropriate testing circuitry. The card cage has a front open face surrounded by peripheral frame 26. The cards each have front edges facing the front face of the card cage and lying in a common, vertical plane. Each card has a row of connector terminals, pads or exposed traces extending adjacent its first edge, which are connected to appropriate points in the circuit card or printed wiring board for signal transmission.

The interface test adaptor unit consists of an outer frame 32 having opposing faces across which are mounted on panel 36. A series of suitable cable connectors are mounted across the panel for connection to cables linking the unit to a unit under test. The other panel 36, which comprises a printed wiring board in the preferred embodiment of the invention, has terminals or contact pads 40 on its outer face for connection to corresponding terminals on the circuit cards. The terminals are connected together by a connection assembly consisting of a series of connector units 42 each mounted on the front edge of a respective circuit card 34 for connecting the terminals on that card to appropriate terminals or contact pads on the outer face of the panel 36. Pins 44 projecting from the four corners of the outer face of the interface test adaptor engage in corresponding holes 45 on the four corners of the card cage frame to align the interface test adaptor within the card cage.

U.S. Pat. No. 4,329,005 to Braginetz et al. discloses a receiver that includes an inner frame and outer walls. Between the outer walls and adjacent side of the receiver is frame are placed fixed hanger plates provided with straight slots and interior slides having co-acting cam slots. The slides are driven by a hand lever and attached torsion shaft with connected slotted linkage having an over-dead-center locked position. An individual test adaptor has four sets of dual bearings or rollers on common dry lube sleeves and can rotate oppositely during the camming action to minimize friction. The individual test adaptor rollers rest on dwell shoulders of the cam slots and then descend through the straight slots during movement of the slides to produce positive straight-on engagement of test adaptor and receiver multiple contacts, such as ball detent contacts with paddle contacts.

U.S. Pat. No. 5,103,378 to Stowers et al. relates to an electronic equipment enclosure includes a card cage for holding a plurality of electronic instrumentation circuit cards. Interface adaptors are mounted on the front panels of each of the circuit cards to provide external connections to respective ones of the circuit cards through a connector module at the front end of each interface adaptor. A pair of positioning pins are mounted on the front of each interface adaptor on opposite sides of the respective connector module. A receiver is hinged to the front of the enclosure and includes upper and lower frames having a series of holes therethrough in correspondence with respective ones of the alignment pins. When the receiver is placed in an upright closed position, the alignment pins engage respective ones of the holes to accurately position the front of each adaptor module and corresponding connector module which extend into a module access space between the frames.

U.S. application Ser. No. 08/344,575 to Stowers et al. now U.S. Pat. No. 5,633,597, describes a related application, a connection interface system using a slide mechanism, incorporated herein by reference (See FIGS. 3–6). FIGS. 3 and 4 are respective bottom and top views of the top frame of the receiver module in the connector interface system. As shown on FIGS. 3 and 4, top frame 115 includes main surface 130 with receiver module pockets 108. Male bayonets 112 (not shown) are inserted in male bayonet mounting holes 112' for securing receiver module 110 to interchangeable test adaptor module 100. Top frame 115 further includes top frame slide support 131 with slide guide projections 132 to stabilize the sliding mechanism (not shown) in receiver module 110. Slide guide projections 132 include top frame bearing holes 133, 133' which receive a slide bearing pin which is inserted through the slide mechanism in receiver module 110. Top frame bearing holes 133, 133' are preferably constructed so that a slide pin in threaded on the end which is inserted into hole 133 and is flat in the area between holes 133, 133' where the sliding mechanism is inserted in top frame 115.

Top frame 115 also includes linkage pocket 134 and torsion shaft support clearance pockets 136 which provide additional clearance for the sliding mechanism linkage and torsion shaft when the sliding mechanism is used to engage the top frame 115 with bottom frame 114 of receiver module 110. Top frame 115 includes torsion shaft access passage 135 which permits the torsion shaft to extend beyond top frame 115 for connection to handle 116 (not shown) to actuate the sliding mechanism in receiver module 110. Top frame 115 includes slide bearing screw access holes 137 which permit access to the sliding pin which accesses slide bearing hole 133 of top frame 115. In addition, top frame 115 includes main surface supports 138 for further securing the main surface to the peripheral structure 138' of top frame 115.

FIG. 5 illustrates the receiver module with the top and bottom frames engaged while revealing slide link 153 and shaft link 154. FIG. 6 is a side sectional view of the slide mechanism when interchangeable test adaptor and receiver are engaged. As shown in FIG. 6, male bayonets 112 are engaged in female bayonet mounting holes 104, and alignment pin 145 protrudes through bushing hole 113 of top frame 115 and bushing hole 105 of interchangeable test adaptor 100. In addition, the slide pins of top frame 115 are inserted in slide bearing hole 133 and are engaged in slide engaged portion 158b of slide diagonal hole 158. The slide pins for bottom frame 114 are inserted in bottom frame slide bearing holes 144 which are engaged in slide transverse hole 157.

Additional U.S. patent references are, for example, the integrated circuit burn-in apparatus disclosed in U.S. Pat. No. 5,086,269 to Nobi, the integrated circuit socket in U.S. Pat. No. 4,560,216 to Egawa, the modular socket in U.S. Pat. No. 5,176,525 to Nierescher et al., the vacuum test fixture disclosed in U.S. Pat. No. 4,667,155 to Coiner et al., and the test fixture in Golder et al., all of which are hereby incorporated by reference. These patent references generally relate to standard connection systems having a fixed hinge that permanently attaches upper and lower sections together.

The above engagement mechanism designs, however, do not address the issue of repeatedly and reliably engaging multiple electrical contacts using a rapid engagement interface connection system. The above engagement mechanism designs further do not address the issue of repeatedly and reliably engaging a testing device to a device under test in an efficient and rapid manner.

We have discovered, however, that a need exists for a connector system providing easy and rapid connection between a device under test and a testing device for smaller applications.

We have also discovered that there is a need to provide a connection interface system which is relatively inexpensive and light in weight for consistently and precisely connecting a testing device with the device under test.

We have also discovered that there is a need for a connection interface system which utilizes a pivoting mechanism to distribute the force and substantially uniformly engage the interchangeable test adaptor with the receiver module for connecting the testing device to the device under test.

We have further discovered the need for a rapid connection interface system where the wiring and receiver modules are positioned for engagement in a manner that creates a wiping action between the contacts disposed in each of the modules. This wiping action, we have discovered, provides enhanced electrical contact between the wiring and receiver modules of the rapid action connection interface system.

We have further discovered that to provide the rapid action engagement between the wiring and receiver modules with wiping action, a pivoting mechanism, preferably removable or separatable, disposed between the modules is beneficial and/or needed.

We have further discovered that this rapid engagement mechanism is particularly suited for small applications when, for example, the device under test is has only a limited number of electrical connections.

DISCLOSURE OF THE INVENTION

A feature and advantage of the invention is to provide a connection interface system permitting ready installation and replacement of electrical contacts requiring frequent changing for connecting a device under test to a testing device.

Another feature and advantage of the invention is to provide a connection interface system for directly connecting electronic circuitry on opposing modules, assemblies and/or substrates.

Another feature and advantage of the invention is to provide a low loss signal path between electronic devices.

Another feature and advantage of the invention is to provide a connection interface system which is relatively inexpensive and light in weight for consistently and precisely connecting a testing device with the device under test.

Another feature and advantage of the invention is to provide a reliable and durable connector system to properly engage the testing device to the device under test when a large number of electrical connectors are used.

Another feature and advantage of the present invention is to provide a connector system with easy and rapid connection between a device under test and a testing device for smaller applications.

Another feature and advantage of the present invention is to provide a connection interface system which utilizes a pivoting mechanism to distribute the force and substantially uniformly engage the interchangeable test adaptor with the receiver module for connecting the testing device to the device under test.

Another feature and advantage of the present invention is to provide a rapid connection interface system where the wiring and receiver modules are positioned for engagement in a manner that creates a wiping action between the contacts disposed in each of the modules.

Another feature and advantage of the present invention is to provide the rapid action engagement between the wiring and receiver modules with wiping action using a pivoting mechanism disposed between the modules.

The present invention is based, in part, on the identification of the problem of minimizing testing device idle time particularly when testing smaller applications or smaller devices under test. In accordance with the features of the present invention, a unique rapid engagement connection interface system has been designed to facilitate rapid engagement and disengagement of the testing device from the device under test.

To accomplish the above, we have discovered that a simplified pivoting joint or pivoting design, that is preferably removable or separatable, including optional guides accomplishes the desired rapid engagement. Additional features have also been designed to further facilitate the rapid engagement connection interface system.

To achieve these and other objects, a rapid action engagement connection interface system is provided which positions and electrically connects a testing device to a device under test. The testing device exercises and tests the device under test. The rapid action engagement connection interface system includes a receiver (or receiver module) electrically connected to the device under test and including at least one receiver electrical connector. The receiver includes a receiver main body section accommodating at least one receiver electrical connector. The receiver main body has upper and lower receiver sections and first and second receiver sides.

The receiver also includes a pivot tab or receptacle, connected to, or integral with, the lower receiver section of the receiver main body section, first and second fin-shaped guides, connected to, or integral with, the first and second receiver sides, respectively, and a locking latch mechanism disposed on the upper receiver section of the receiver main body section.

The rapid action engagement connection system also includes an interchangeable test adaptor electrically connected to the device under test, removably couplable to the receiver and including at least one test electrical connector. The interchangeable test adaptor includes a test main body section accommodating the test electrical connector, and a pivot tab receiver (or pivot receptacle receiver), connected to, or integral with, the lower test section of said test main body section. The interchangeable test adaptor includes first and second fin-shaped grooves, connected to, or integral with, the first and second test sides, and a locking latch receiver disposed on the upper test section of said test main body section.

When the pivot tab engages the pivot tab receiver, the receiver is pivotally engagable with the interchangeable test adaptor. The receiver is pivotally guided into engagement with the interchangeable test adaptor utilizing the first and second fin-shaped guides that are introduced into the first and second fin-shaped grooves respectively. The receiver is secured to the interchangeable test adaptor utilizing the locking latch mechanism and the locking latch receiver.

In another embodiment of the invention, a rapid action engagement interface connection system is provided for positioning and electrically connecting a testing device to a device under test. The testing device exercises and tests the device under test. The rapid action engagement interface connection system includes a receiver electrically connected to the device under test and including at least one receiver electrical connector.

The receiver includes a receiver main body section accommodating the at least one receiver electrical connector. The receiver main body has upper and lower receiver sections and first and second receiver sides.

The receiver includes a pivot tab or receptacle, connected to, or integral with, the lower receiver section of the receiver main body section, first and second guides, connected to, or integral with, the first and second receiver sides, and a locking latch mechanism disposed on the upper receiver section of the receiver main body section. The rapid action engagement interface connection system also includes an interchangeable test adaptor electrically connected to the device under test, removably couplable to the receiver and including at least one test electrical connector.

The interchangeable test adaptor includes a test main body section accommodating at least one test electrical connector, and a pivot tab receiver, connected to, or integral with, the lower test section of the test main body section. The interchangeable test adaptor includes first and second guide receivers, connected to, or integral with, the first and second test sides, and a locking latch receiver disposed on the upper test section of the test main body section.

In another embodiment of the invention, a method of positioning and engaging a test electrical connector with a receiver electrical connector using a rapid action engagement interface connection system is provided. The method includes the steps of mounting the test electrical connectors to the interchangeable test adaptor, mounting the receiver electrical connectors to the receiver, and engaging a pivot tab of the receiver with a pivot tab or pivot receptacle receiver of the interchangeable test adaptor.

The method also includes the steps of pivotally guiding and engaging the interchangeable test adaptor with the receiver via the pivot tab and the pivot tab receiver, thereby engaging the test electrical connector to the receiver electrical connectors, and locking the interchangeable test adaptor with the receiver via a locking mechanism.

The foregoing and other objects, features, aspects and advantages of the present invention will become more apparent from the following detailed description of the present invention when taken in conjunction with the accompanying drawings.

BRIEF DESCRIPTION OF DRAWINGS

FIGS. 15 and 16 are respective top and side views of a first latch component in the rapid action engagement interface connection system;

FIGS. 17, 18 and 19 are respective top and sectional views of a locking cylinder component in the rapid action engagement interface connection system;

FIGS. 20 and 21 are respective top and side views of a second latch component in the rapid action engagement interface connection system;

BEST MODE FOR CARRYING OUT THE INVENTION

The rapid action engagement interface connection interface system positions and electrically engages a testing device to a device under test. The testing device then exercises and tests the device under test in a timely manner. Idle time of the testing device is thereby minimized using the rapid action engagement interface connection system. In accordance with the rapid engagement interface connection system, we have discovered that a pivoting joint or pivoting hinge design facilitates the rapid engagement between a receiver and testing module.

Figure 1:
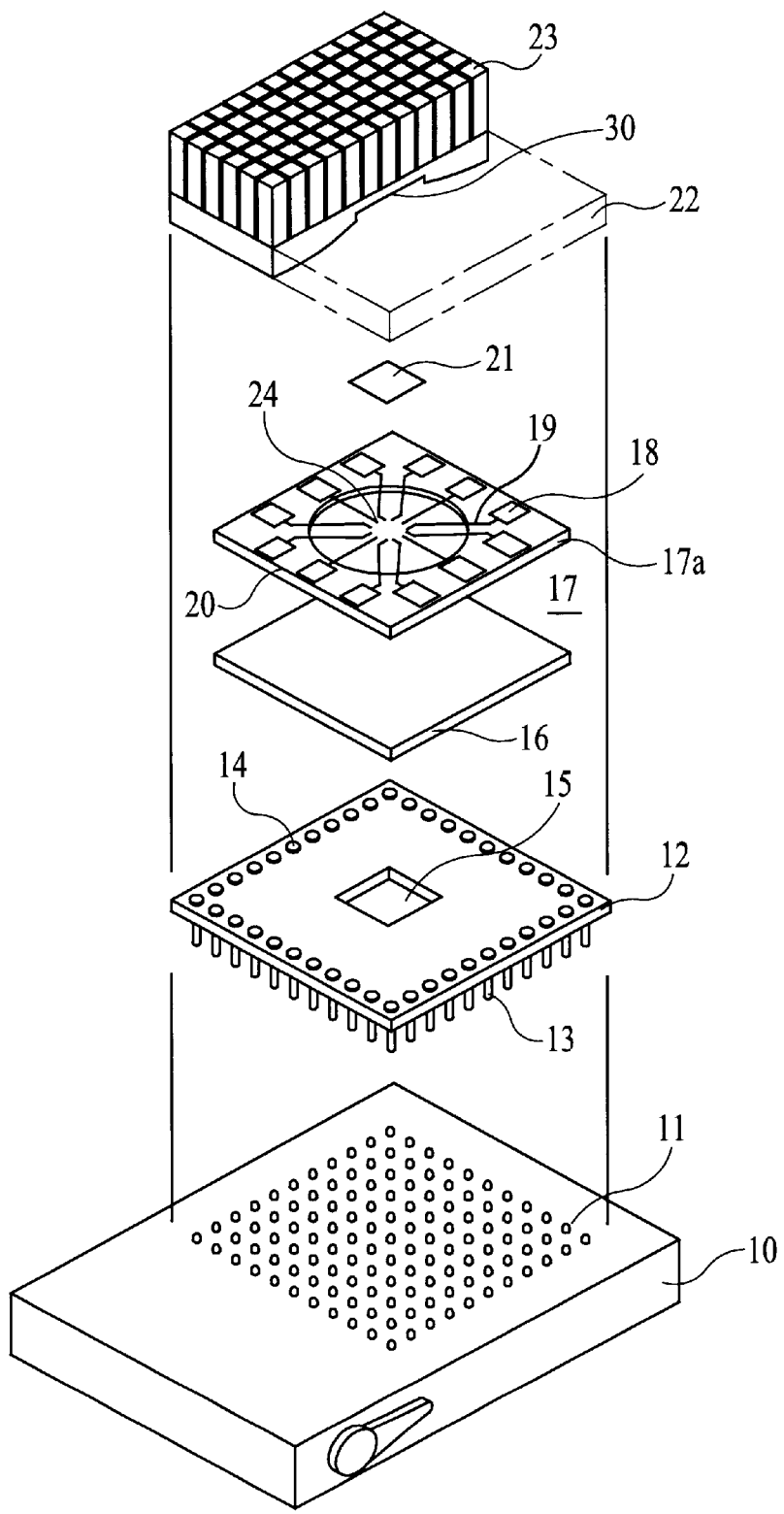
FIG. 1 is an illustration of a prior art burn-in test socket.
Figure 2:
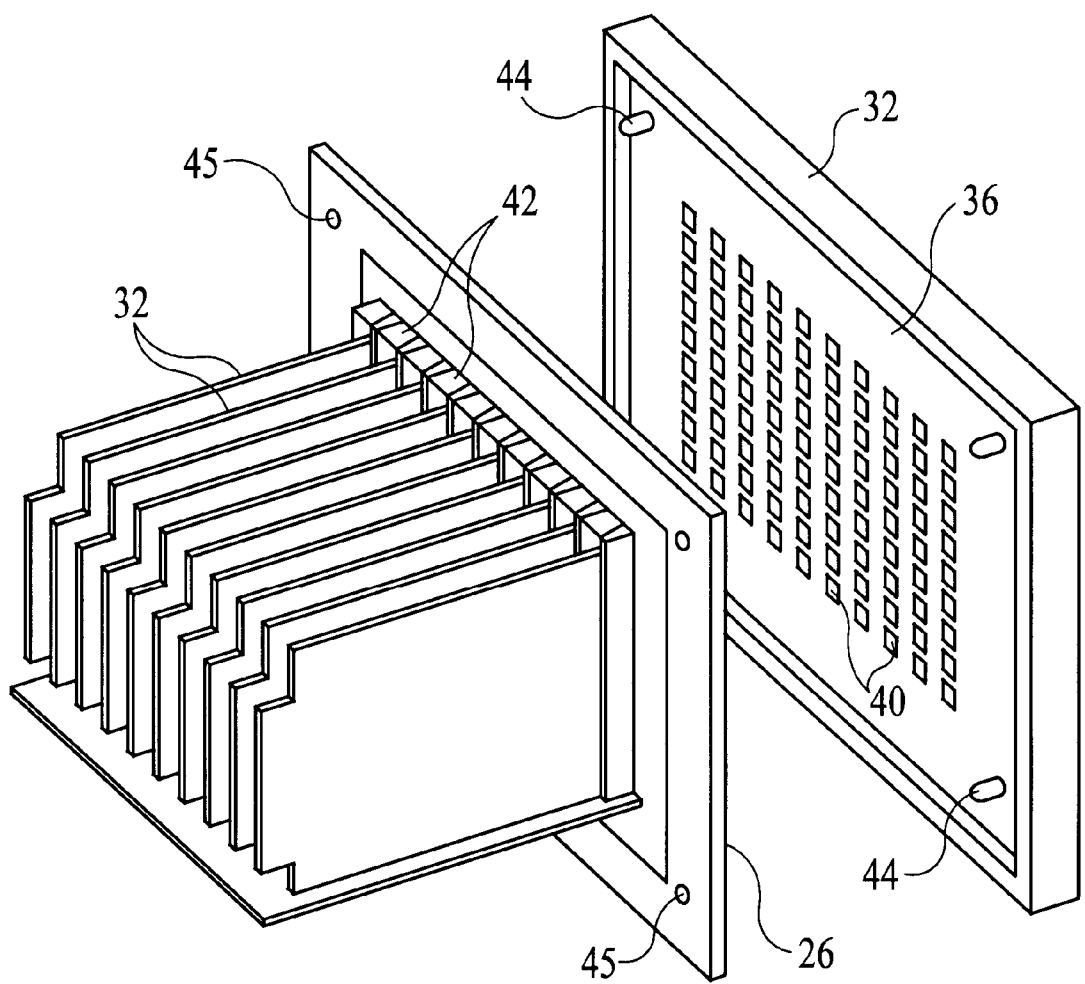
FIG. 2 is an illustration of a prior art interconnection assembly.
Figure 3:
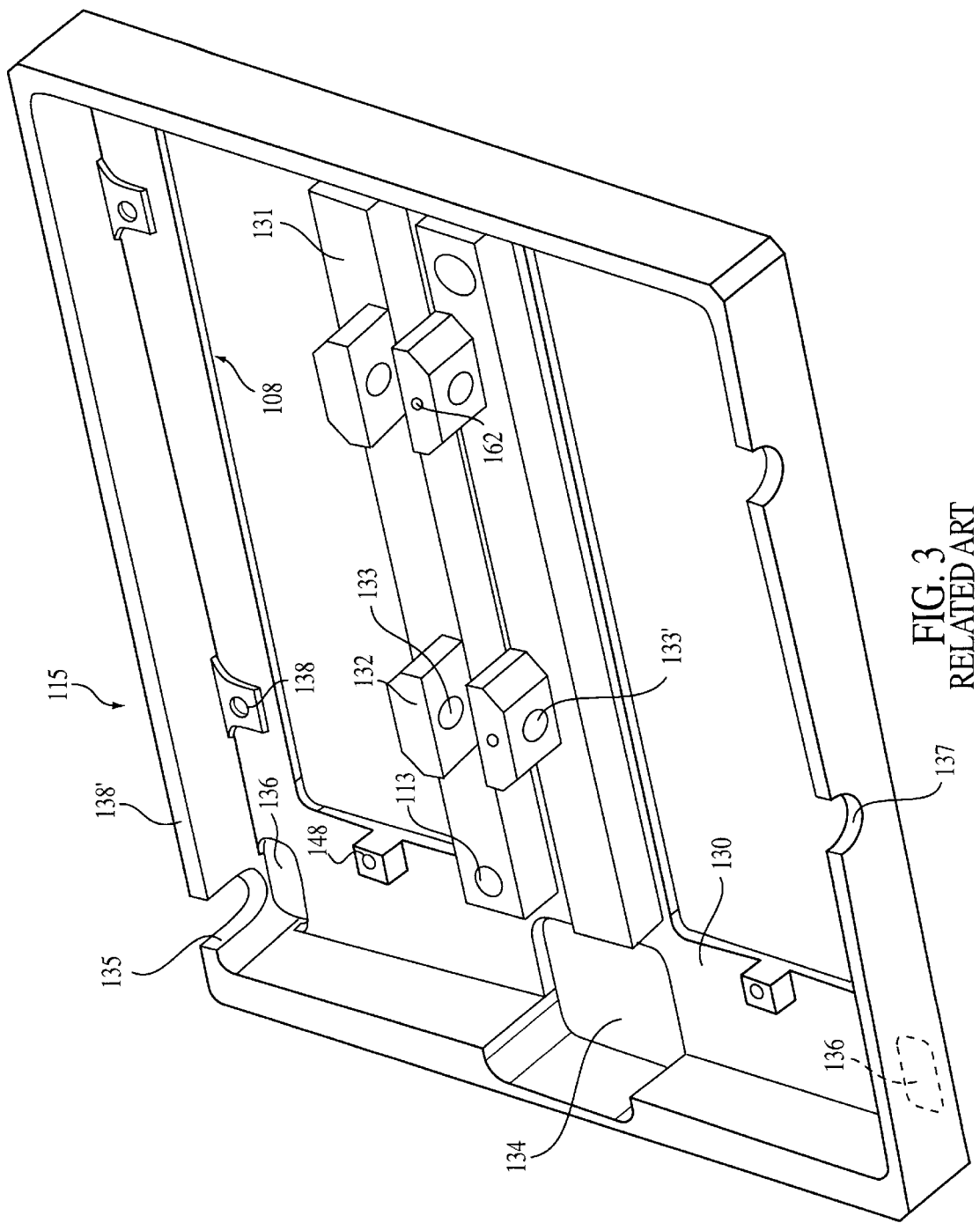
FIG. 3 is a bottom view of the top frame of a related art receiver in a connector interface system.
Figure 4:
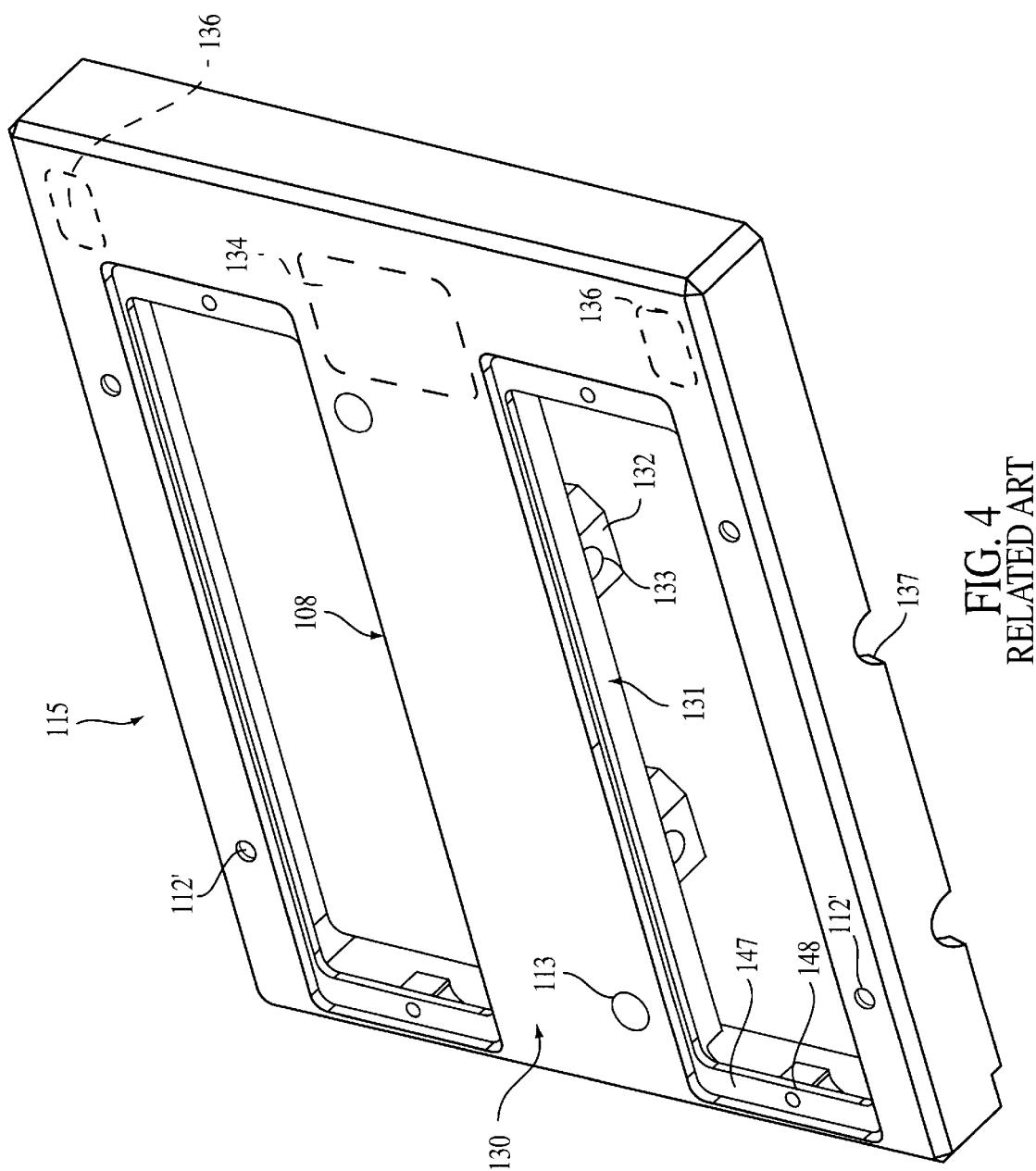
FIG. 4 is a top view of the top frame of a related art receiver in a connector interface system.
Figure 5:
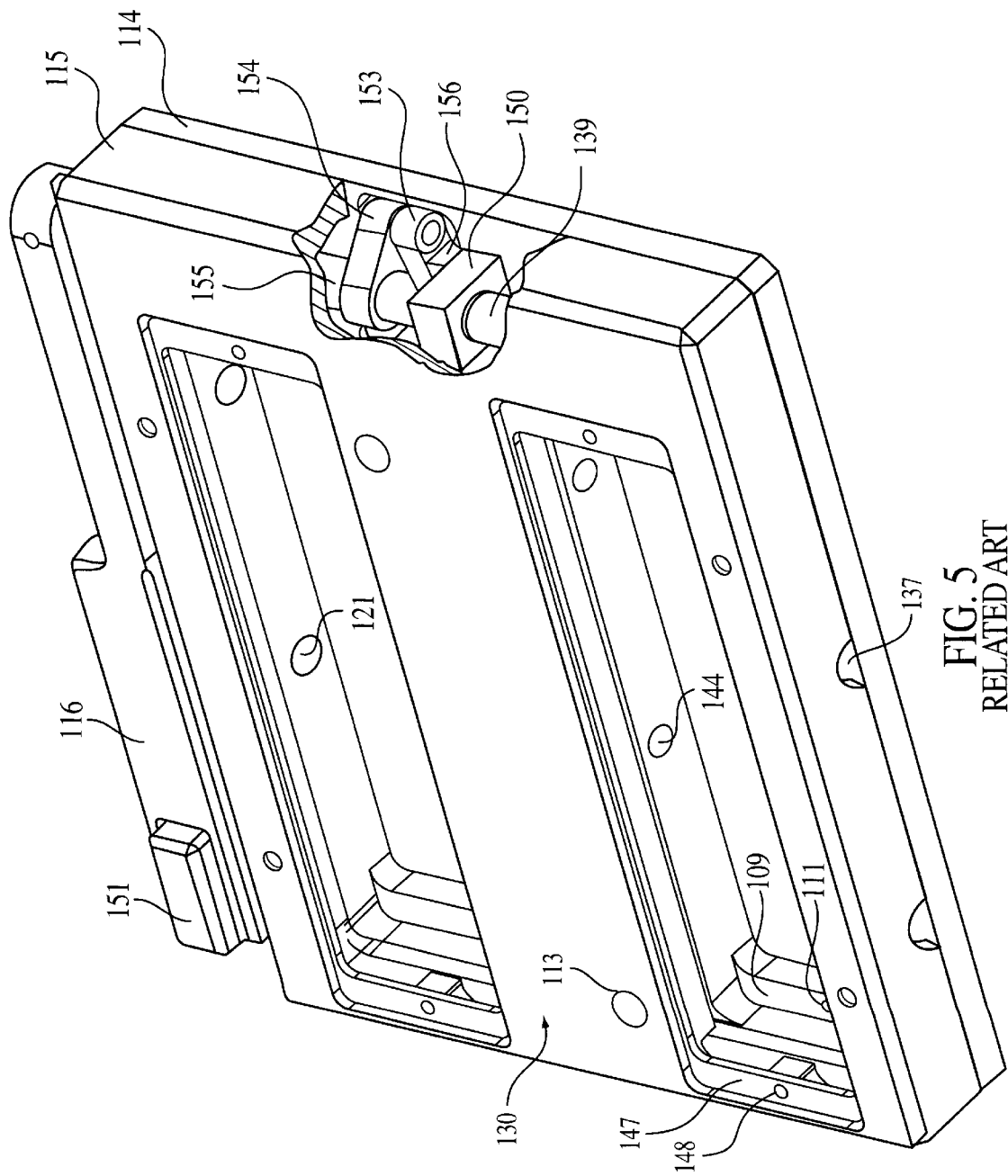
FIG. 5 is a top view of a related art receiver with the handle and linkage connected to the top and bottom frames in a connector interface system.
Figure 6:
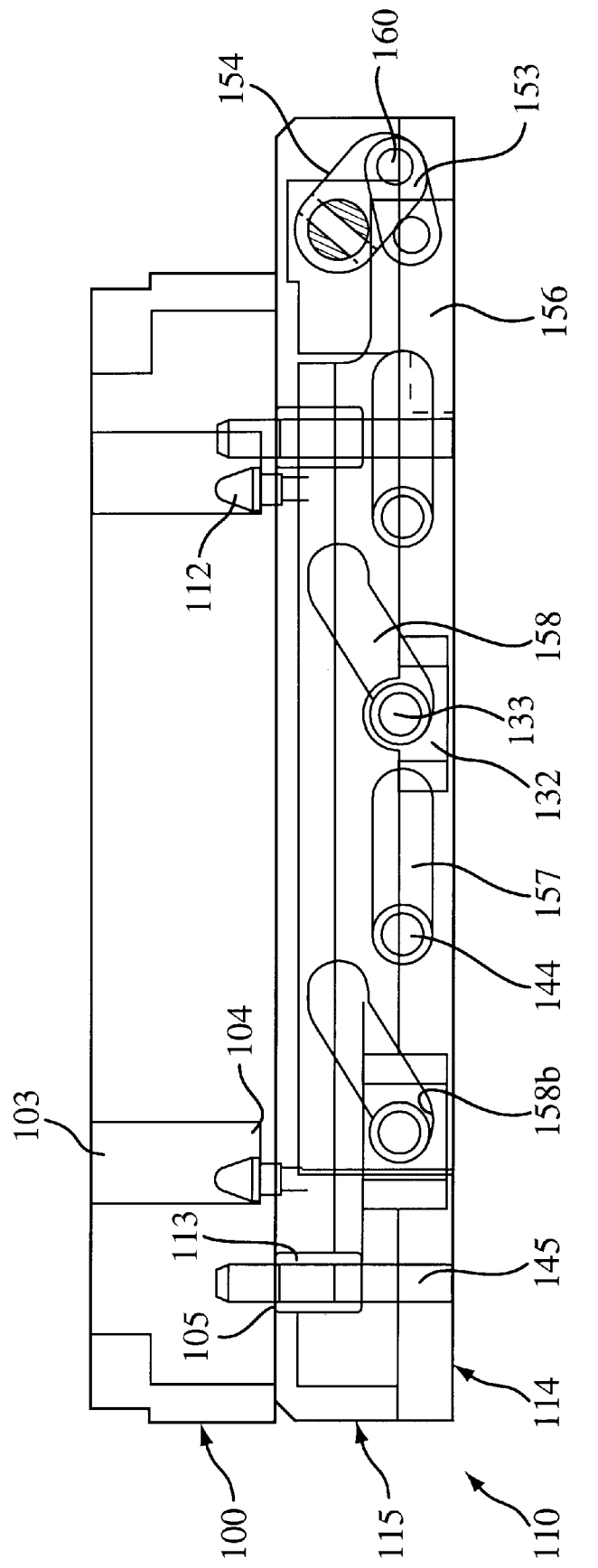
FIG. 6 is a side sectional view of a related art interchangeable test adaptor and receiver engaged in a connector interface system.
Figure 7:
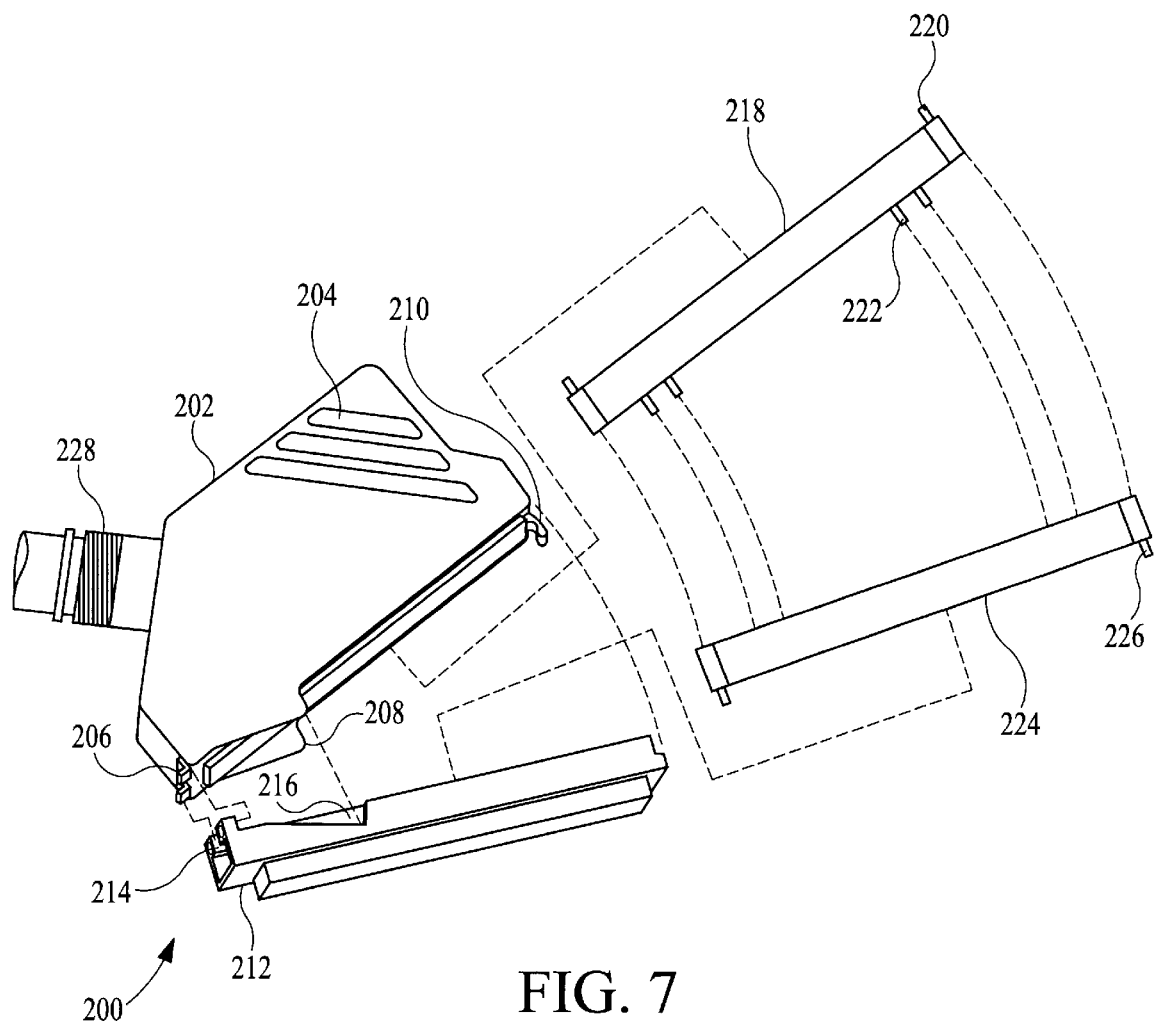
FIG. 7 is an isometric view of the rapid action engagement interface connection system.
Figure 7A:
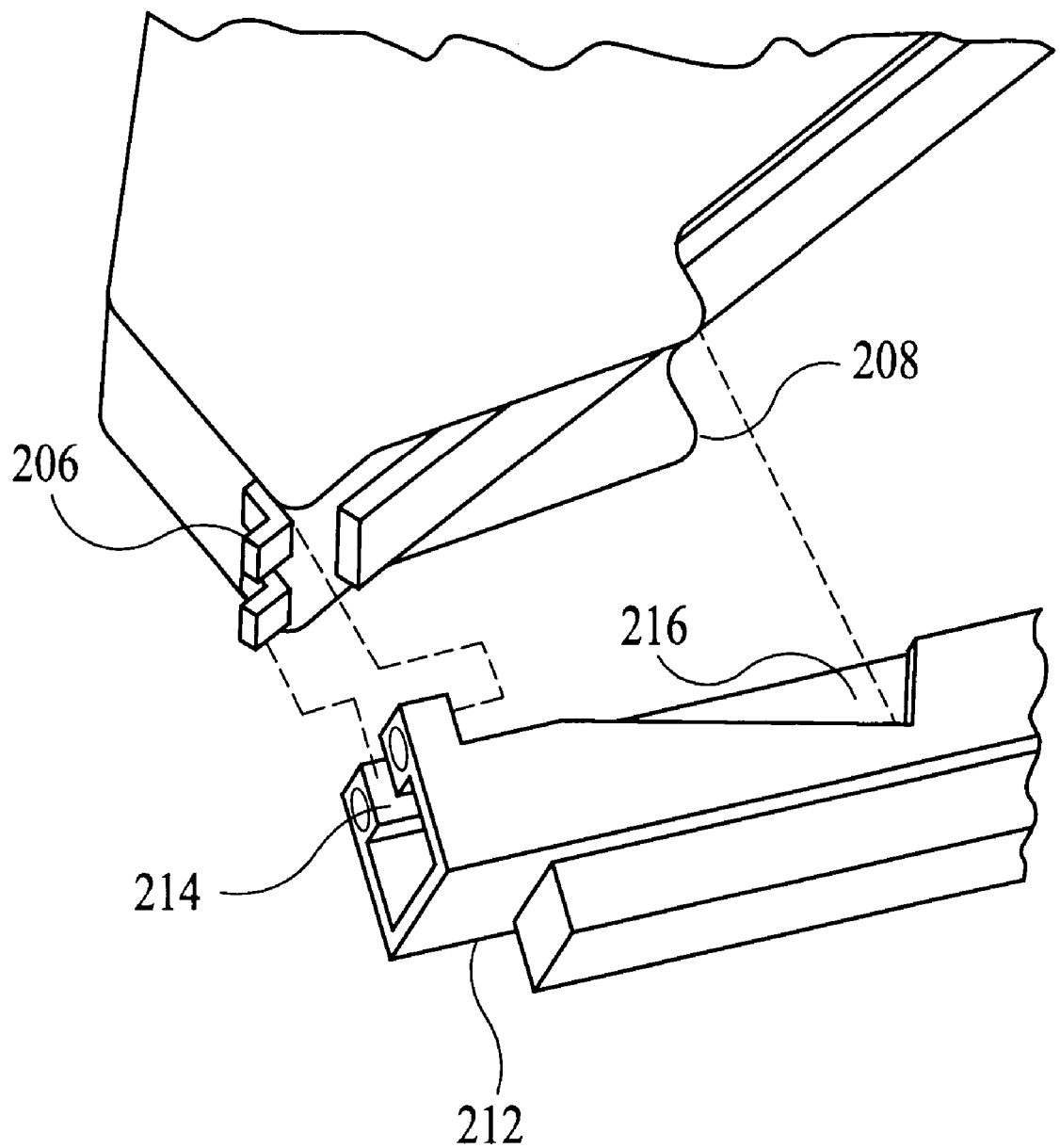
FIG. 7A is an enlarged isometric view of the pivoting mechanism in the rapid action engagement interface connection system.

FIGS. 7 and 7A illustrate an embodiment of the rapid engagement connection interface system. As illustrated in FIGS. 7 and 7A, rapid action engagement interface connection system 200 includes test adaptor 202 to be engaged with receiver 212. Test adaptor 202 includes recessed elongated ribs or grooves 204 used to facilitate the gripping of the test adaptor 202 by a user.

Test adaptor 202 further includes tabs or feet 206 used in the pivoting mechanism of the connection interface system, and guide or fin projections 208 that facilitate the guiding of test adaptor 202 when being connected with receiver 212. Specifically, tabs 206 are inserted in receiving receptacles or holes 214 creating a pivot along the bottom of rapid action engagement connection system 200. Further, guide or fin projections 208 are inserted in fin grooves 216 as test adaptor 202 becomes engaged with receiver 212.

Test adaptor 202 further includes locking mechanism 210 which is explained in further detail below. Locking mechanism 210 ensures a secure engagement between test adaptor 202 and receiver 212, thereby preventing any unexpected and untimely disengagement of the rapid action engagement interface connection system.

Test adaptor 202 includes test adaptor surface contact and/or probe assembly 218 mounted therein via, for example, screw connector. 220. Test adaptor surface contact assembly 218 is used to house or accommodate electrical probes and/or contacts 222, discussed in greater detail below.

Receiver 212 houses or accommodates receiver module surface contact and/or probe assembly 224 which is connected thereto via screw connector 226. Of course, other means of connection may be used instead of screw connectors 220 or 226. Cable access tube 228 is also provided which shields and protects conductors or cables connected directly between the testing device and test adaptor 202. Various alternative/modified designs are also considered within the scope of the present invention. For example, guide or fin projections 208 may be formed on receiver 212 instead of test adaptor 202, and fin grooves 216 may be formed on test adaptor 202 instead of receiver 212. Similar types of modifications that do not depart from the basic design philosophy of the present invention are also possible.

Figure 8:
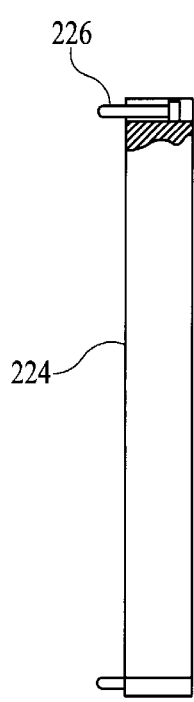
FIG. 8 is a side view of the receiver module surface contact and/or probe assembly in the connector interface system.
Figure 9:
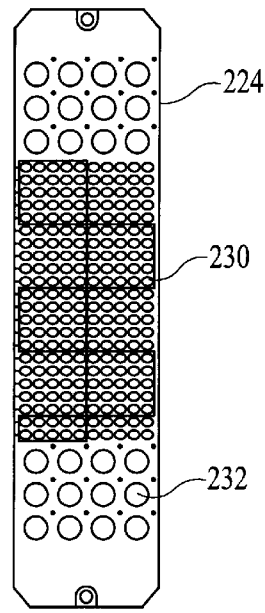
FIG. 9 is a top view of the receiver module surface contact and/or probe assembly in the connector interface system.

FIGS. 8 and 9 are respective side and top views of a receiver module surface contact and/or probe assembly 224 which is secured to the receiver. As shown in FIGS. 8 and 9, receiver module surface contact and/or probe assembly 224 includes various surfaces, or contact probes for connection to the receiver module probe assembly. For example, receiver module probe assembly 224 may include receiver probe coaxial twin access connector (CTAC™) mating surface 232 or receiver probe twin access connector (TACT™) mating surface 230. Receiver module probe assembly 224 further includes receiver module assembly mounting screw 226 for securing receiver module probe assembly 224 to the receiver. Of course, any type of connection means may be used to connect receiver module probe assembly 224 to the receiver.

Figure 10:
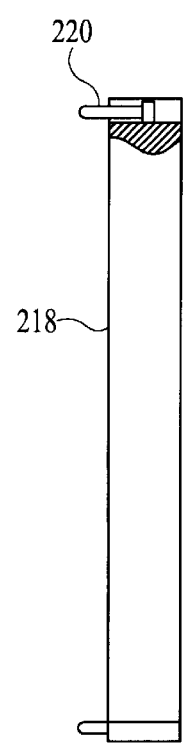
FIG. 10 is a side view of the interchangeable test adaptor module surface contact and/or probe assembly in the connector interface system.
Figure 11:
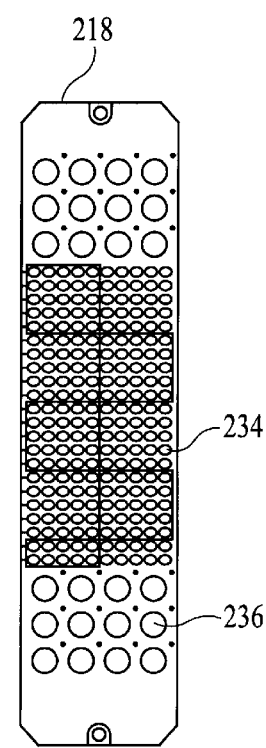
FIG. 11 is a top view of the interchangeable test adaptor module surface contact and/or probe assembly in the connector interface system.

FIGS. 10 and 11 are respective side and top views of the interchangeable test adaptor module probe assembly. As shown in FIGS. 10 and 11, interchangeable test adaptor module surface contact assembly 218 includes interchangeable test adaptor surface contact 234 which provides the electrical connection with a TAC probe embedded therein with the TAC mating surface 230 (see FIG. 9), and coaxial TAC 236 permits electrical connection between a coaxial TAC embedded therein and coaxial mating surface 232 of the receiver module probe assembly 224 (see FIG. 9). Interchangeable test adaptor module probe assembly 218 also includes an interchangeable test adaptor module assembly mounting screw 220 which mounts the interchangeable test adaptor module probe assembly 218 to the test adaptor module.

Accordingly, the use of interchangeable test adaptor module surface contact and/or probe assembly 218 and receiver module contact and/or probe assembly 224 facilitates the connection between the testing device and a unit under test since modules 224 and 218 organize and reliably establish electrical between the testing device and the unit under test.

Figure 12:
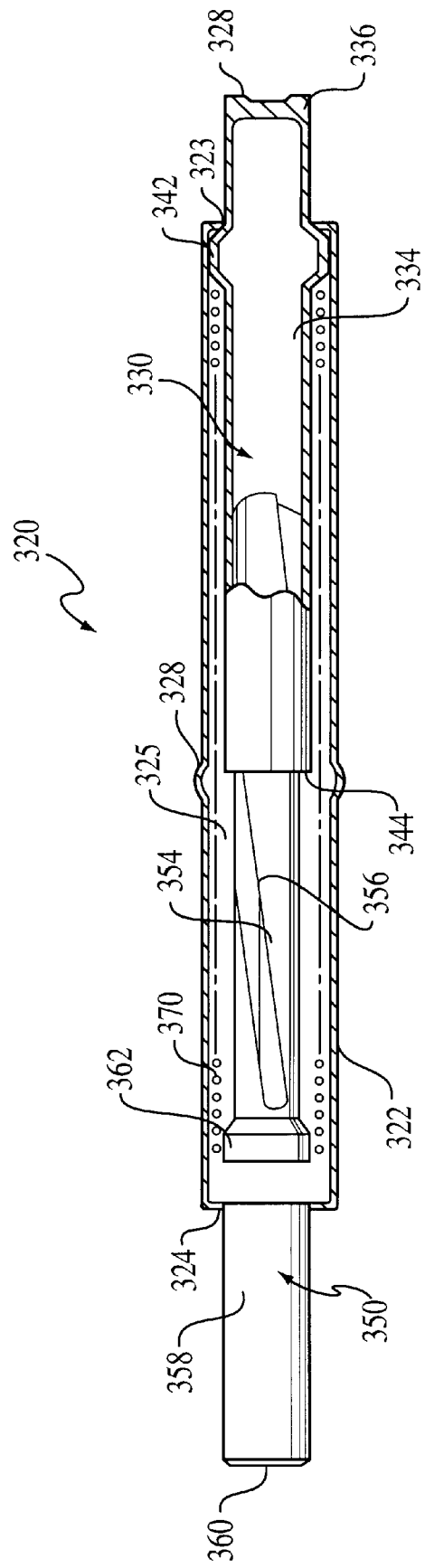
FIG. 12 is a partial cross sectional view of a double-headed twist probe.

Referring to FIG. 12, one example of a contact probe mounted in the interchangeable test adaptor module probe assembly is illustrated. A miniature double-headed twist probe 320 includes a hollow tubular housing 322 having open ends 323 and 324. A tubular plunger 330 is slidably positioned within central cavity 325 of housing 322, extending outward through aperture 323 and terminating in contact tip 338.

An internal barrel portion 334 of plunger 330 is coaxial with housing 322, extending approximately to the midpoint of the housing. Opposing rod-like plunger 350 is slidably positioned within an opposite portion of cavity 325, extending out from housing 322 through aperture 324 and terminating in contact tip 360. An internal twisted rod portion 354 of plunger 350 is shaped like a drill bit or slotted helix, extending through a matching aperture or keyway 344 of barrel portion 334. Both plungers 330 and 350 are free to rotate and longitudinally translate within housing 322.

External portions of plungers 330 and 350 are made of a conductive substance such as heat treated beryllium copper (BeCu) or hardened steel plated with gold over nickel. Housing 322 is preferably made of a material such as deep drawn gold plated brass or nickel silver.

Plunger 330 includes lengthwise contiguous internal hollow tubular or barrel portion 334 and external probe portion 336 which axially extends out through an aperture in an end of housing 322. A shoulder portion 342 limits travel of plunger 330, maintaining the probe within housing 322 by engaging a restricted portion of the aperture formed by crimping or rolling. An inner face of shoulder portion 342 serves as a seat for spring 370 which biases plunger 330 outward from housing 322.

Plunger 350 axially extends through an opposite aperture in housing 322 and includes an internal twist rod portion 354 within the housing and an external probe portion 358 having a terminal contact tip 360. Internal twist rod 354 is helically formed and includes a twisted bearing surface 356.

Internal twist rod 354 passes through an aperture forming a keyway 344 in an internal terminal end of barrel 334. Keyway 344 engages twist rod 354, including bearing surfaces 356 thereof so that axial travel of the plungers results in relative rotation thereof.

Spring 370 is positioned within cavity 325 of housing 322, coaxially surrounding barrel 334 and twisted rod 354 of the plungers. Spring 370 is made of a spring material such as stainless steel, music wire or beryllium copper and is positioned within housing 322.

Opposite ends of spring 370 are seated on and engage shoulder portion 342 and collar portion 362 of plungers 330 and 350, respectively, thereby biasing the plungers outward from the housing. Inward travel of plungers 330 and 350 is against an outward bias provided by spring 370. Additional details of this contact probe may be referred to U.S. Ser. No. 08/320,514 to Stowers et, al., filed on Oct. 11, 1994, now U.S. Pat. No. 5,576,631, incorporated herein by reference. Further, the coaxial contact probe may also be utilized as also disclosed in U.S. Ser. No. 08/320,514 to Stowers et al., filed on Oct. 11, 1994, now U.S. Pat. No. 5,576,631, incorporated herein by reference.

Figure 13:
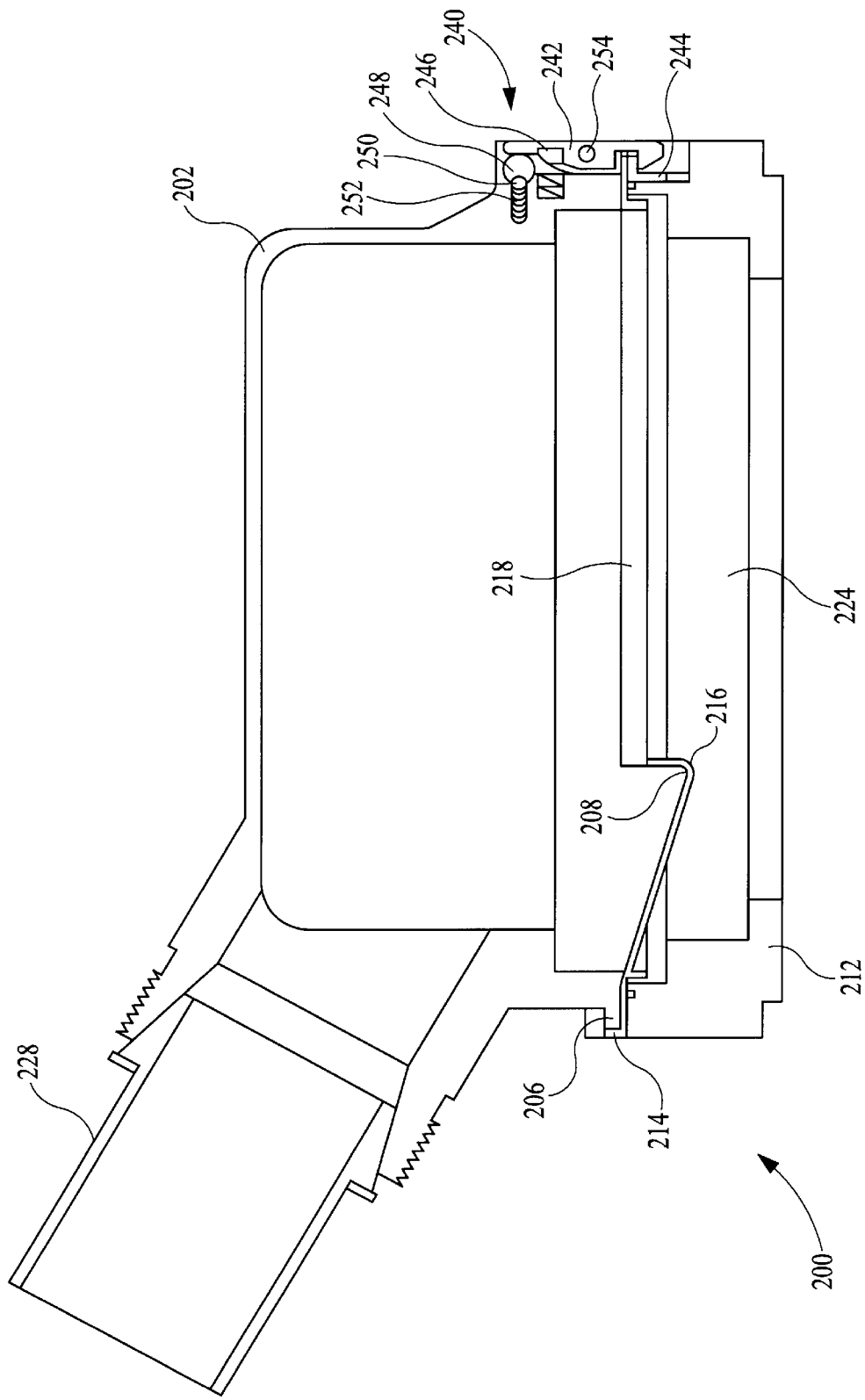
FIG. 13 is a partial sectional side view of the rapid action engagement interface connection system.
Figure 14:
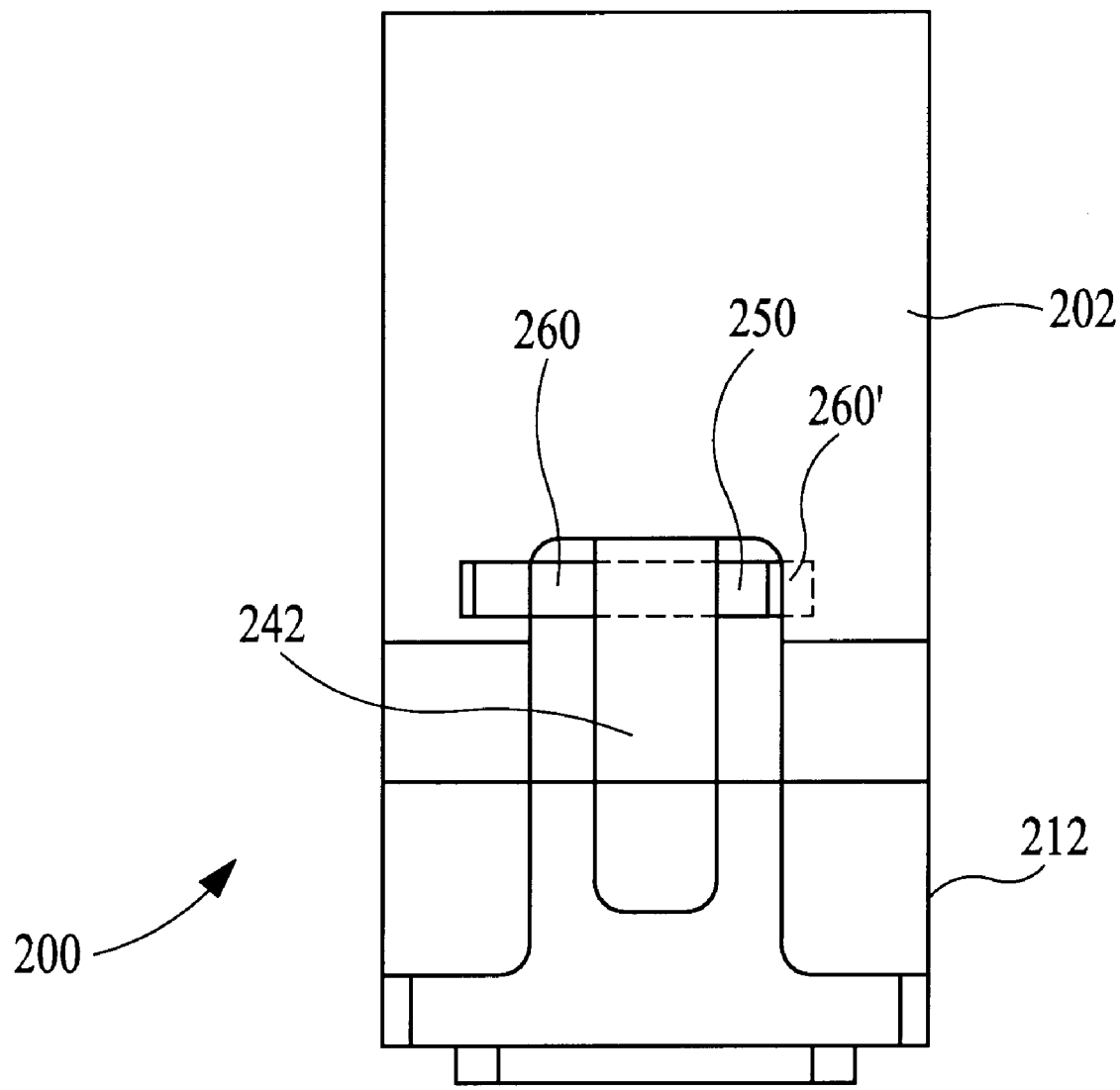
FIG. 14 is a top view of the rapid action engagement interface connection system.

FIGS. 13 and 14 are respective partial sectional side and top views of the rapid action engagement interface connection system. As illustrated in FIGS. 13 and 14, tabs or feet 206 are inserted in receiving receptacles 214. Further, guide or fin projections 208 are also inserted in fin grooves 216 for proper engagement of test adaptor 202 and receiver 212 to each other. Locking mechanism 240 is also engaged, thereby securely engaging test adaptor 202 having test adaptor probe and/or surface contact assembly 218 to receiver 212 having receiver module probe and/or surface contact assembly 224 mounted therein.

Locking mechanism 240 includes latch 242 which pivotally engages receiver latch 244 via latch pivot 254. Spring 246 and latch 242 are in the locked position. Locking cylinder 248 locks latch 242 into the locking position via locking ball 250 and spring 252, as will be discussed in greater detail below.

As illustrated in FIG. 14, latch 242 is in the locked position 260'. When cylinder 248 is urged toward the left, the latch 242 will be in the unlocked position 260, permitting latch 242 to be disengaged from receiver latch 244, and thereby disengaging test adaptor 202 from receiver 212.

FIGS. 15 and 16 are respective top and side views of latch receiver 244 in the rapid action engagement interface connection system. As illustrated in FIGS. 15 and 16, latch receiver 244 includes vertical wall 264 connected to base portion 263. In addition, base portion 263 includes projections 263' which are used to secure latch receiver 244 in a groove disposed at the top of receiver 212.

Accordingly, when latch receiver 244 is inserted in the groove on receiver 212, projections 263' become partially depressed or indented when disposed therein, thereby creating a pressed connection preventing latch receiver 244 from being dislodged from receiver 212. Alternatively, projections 263' may be disposed in the receiver groove for preventing latch 244 from being dislodged from the receiver 212.

FIGS. 17–19 are respective top and sectional views of locking cylinder component 248 in the rapid action engagement interface connection system. As illustrated in FIGS. 17–19, locking cylinder 248 includes unlocked position groove 256 and lock position groove 258, with joining groove 257 connecting therebetween.

Locking cylinder 248 includes latch depression notch 260 for providing sufficient room for latch 242 to be depressed and unlocked from latch receiver 244. Thus, when locking cylinder 248 is urged or positioned in the lock position, latch depression notch 260 is positioned such that latch 242 cannot be inserted completely therein, and when locking cylinder 248 is in the unlocked position, latch depression notch 260 is positioned such that latch 242 may be inserted therein. Locking cylinder 248 further includes tapers 262 to facilitate transverse movement.

FIGS. 20–21 are respective top and side views of latch 242 in the rapid action engagement interface connection system. As illustrated in FIGS. 20–21, latch 242 rotates about pivot 254. Latch 242 includes depression area 266, and receiver hole 268 for receiving spring 246 (not shown). Latch 242 also includes lock engagement notch 270 for engagement with latch receiver 244, thereby locking receiver 212 to test adaptor 202.

Advantageously, we have discovered that utilizing this pivot mechanism for engaging test adaptor 202 to receiver 212, a lateral engagement motion and wiping action is created across the electrical contacts disposed in test adaptor surface contact assembly 218 and receiver module probe assembly 224. This lateral engagement motion is sufficient to cause a wiping action between the electrical contacts of each of the probe assemblies without damaging the contacts embedded therein. Further, when the rapid action engagement interface connection system utilizes the twin access connectors (TAC™) disclosed in U.S. pat. application Ser. No. 08/320,514 to Stowers et al., now U.S. Pat. No. 5,576,631, previously incorporated herein by reference, a double wiping action occurs. Specifically, a rotational wiping action occurs using the twin access connector, and an additional lateral wiping action occurs as the rapid action engagement connection interface system engages test adaptor 202 with receiver 212.

Figure 22:
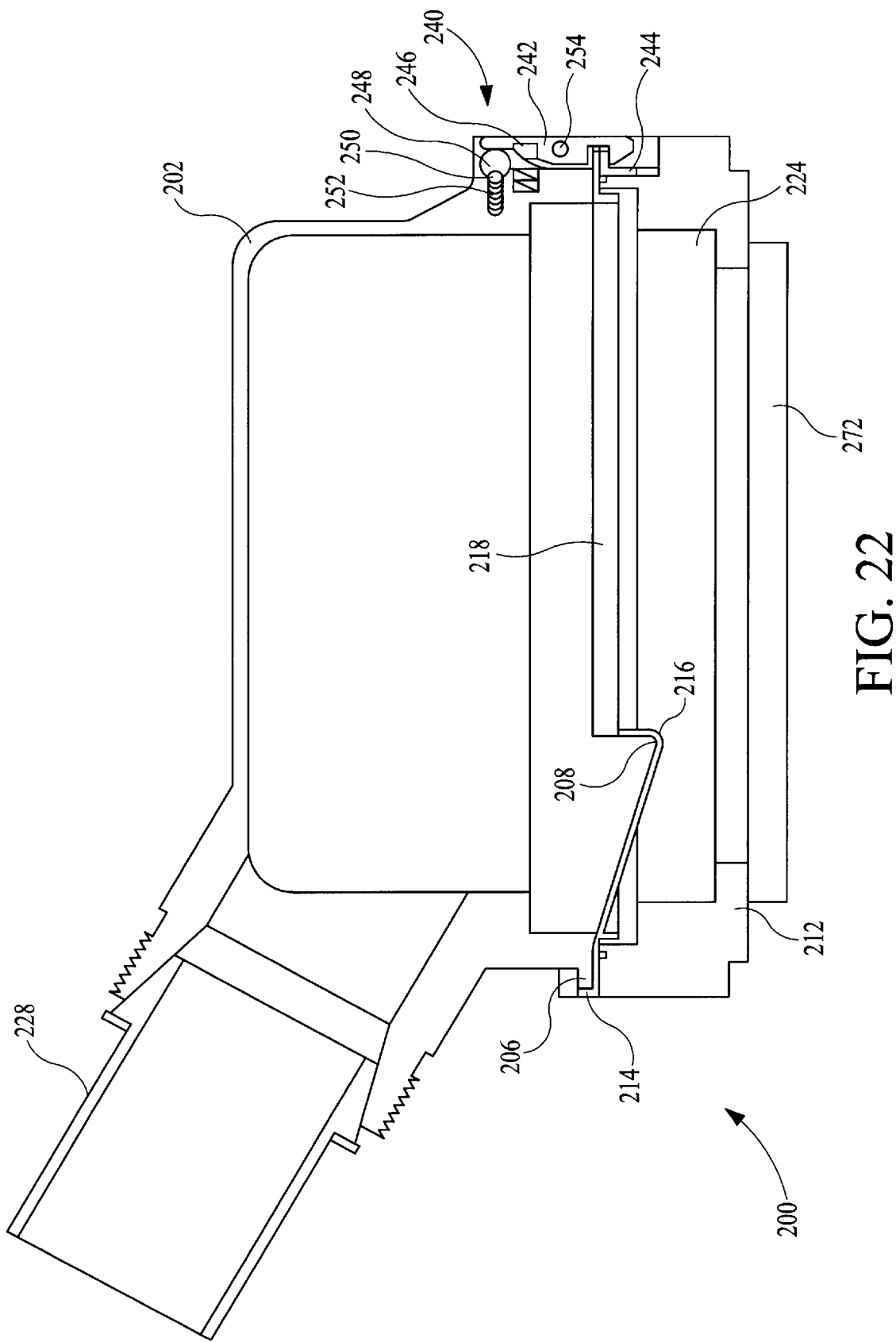
FIG. 22 is a partial side sectional view of the interchangeable test adaptor and receiver engaged electrically connecting a printed circuit board as the device under test to the testing device.

Discrete wiring could also be used in combination with other types of connections in the rapid action engagement connection system. For example, FIG. 22 is a partial side sectional view of the interchangeable test adaptor and receiver engaged electrically connecting a printed circuit board (PCB) or printing wiring board (PWB) to the testing device. PWBs and PCBs are generally used to facilitate connection between the receiver and the testing device. A PCB generally includes, for example, signal filtering devices that are used to enhance or refine the signals transferred between the testing device and the device under test. As illustrated in FIG. 22, PCB or PWB 272 is mounted to receiver 212. In this configuration, PCB/PWB 272 is used as an intermediary connection device to the testing device.

Figure 23:
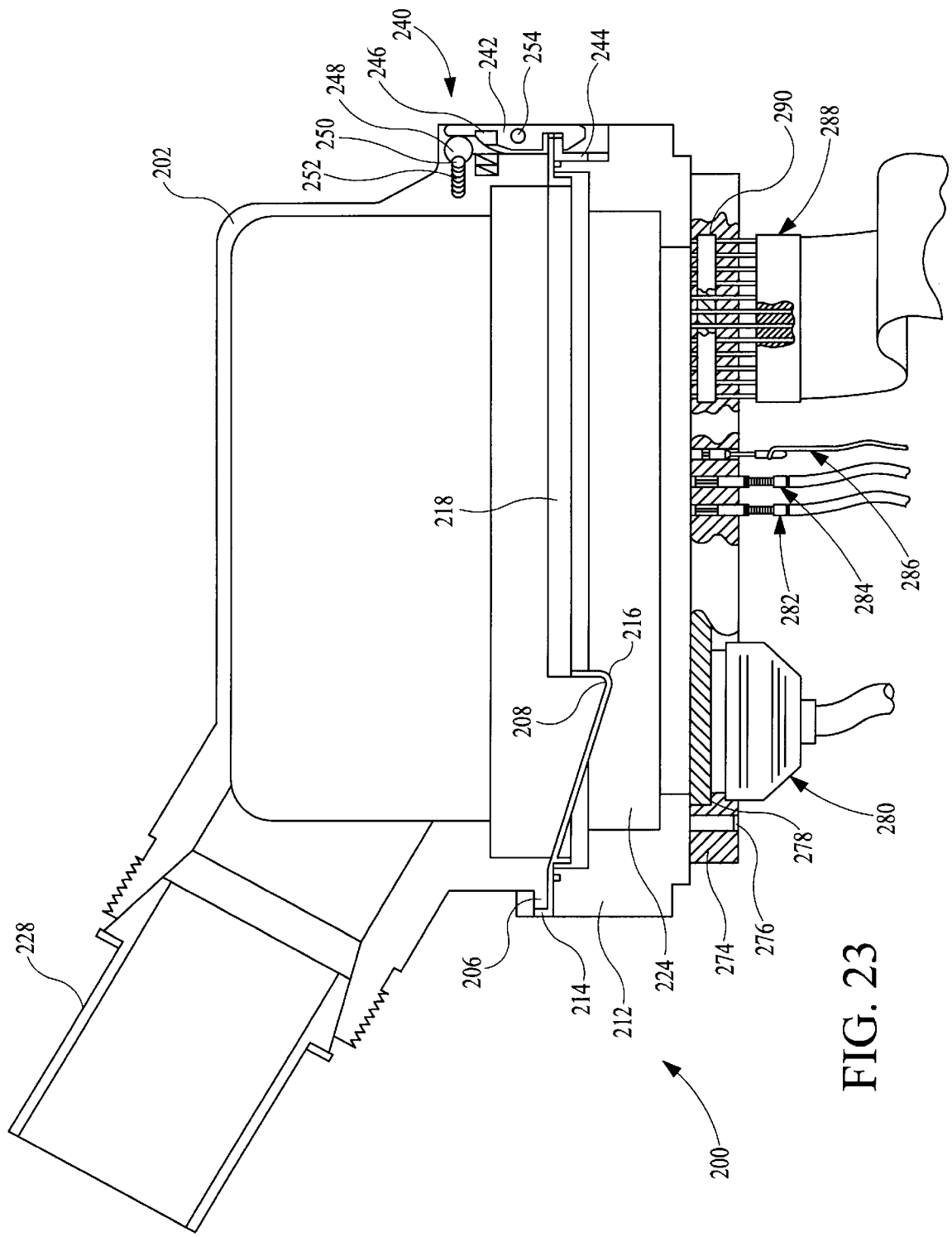
FIG. 23 is a partial side sectional view of the interchangeable test adaptor and receiver engaged illustrating different connections with discrete connectors and a printed circuit board device.

FIG. 23 is a partial side sectional view of the interchangeable test adaptor and receiver engaged illustrating different connections with discrete connectors and a printed circuit board device. As shown in FIG. 23, receiver 212 is mounted to, or connected with, mounting board 274 via, for example, a screw inserted through mounting hole 276. Mounting board 274 includes, for example, printed circuit board 278, general purpose connector 280 (e.g., RS-232 multiple pin connector) connected thereto, crimp connector 282, solder connector 284, wire wrap connector 286, ribbon cable termination connector 288, and PCB with wire wrap post connector 290. Opposite receiver 212 is interchangeable test adaptor 202 including similar or different connectors opposite connectors 278-290 (not shown). For example, interchangeable test adaptor 202 might include a PCB or PWB that is opposite general purpose connector 280 and connected thereto via, for example, double headed spring contact probes in the receiver module probe assembly 224 (not shown). See U.S. patent application Ser. No. 08/643,917 to Stowers et al., filed May 7, 1996, pending, entitled INTERFACE SYSTEM UTILIZING ENGAGEMENT MECHANISM, to inventors Jeffrey P. Stowers, Paul D. Blackard and Randall Clark Garman for similar examples of discrete-discrete, PCB (PWB)-PCB (PWB) and/or PCB-discrete wiring, incorporated herein by reference.

Figure 24:
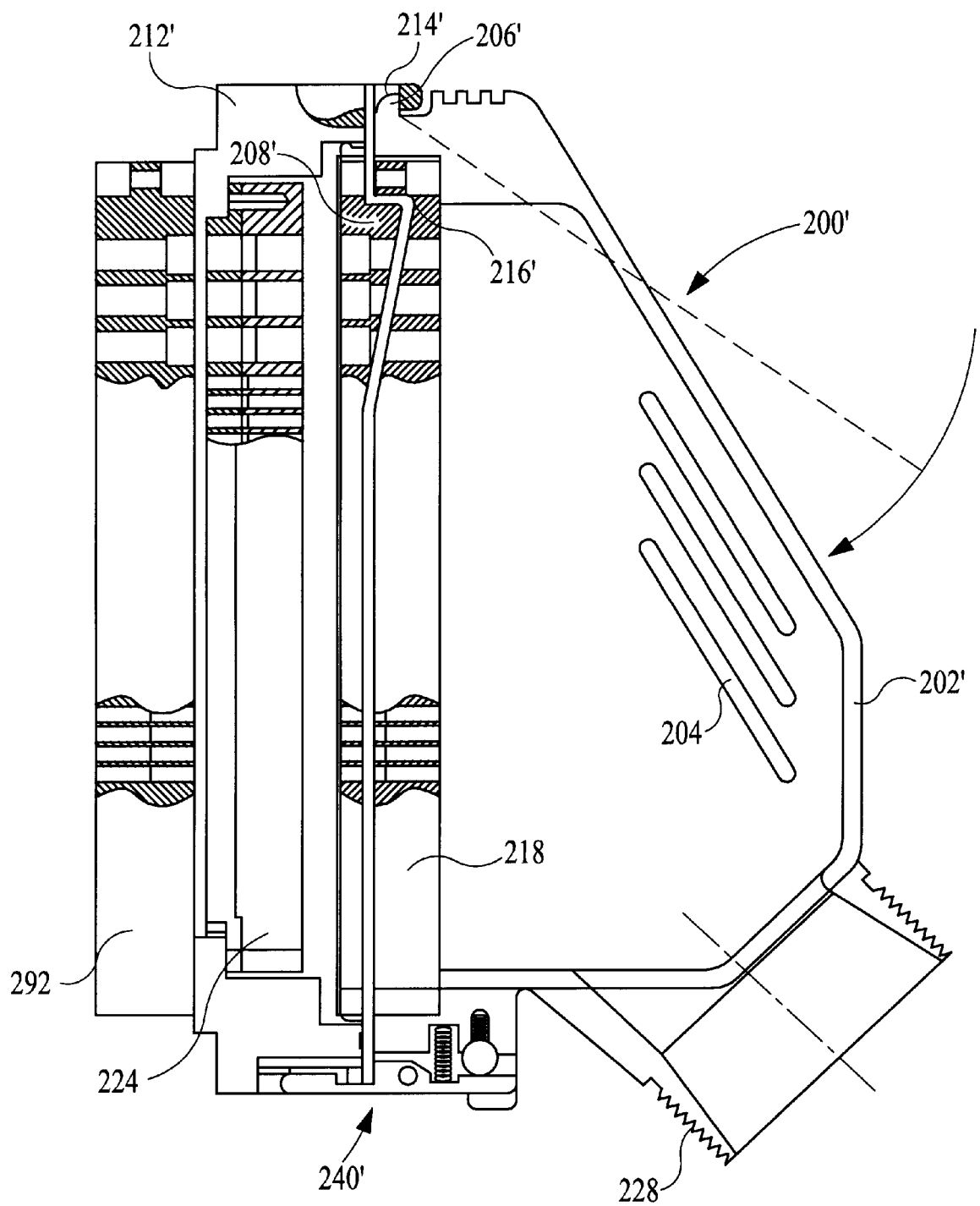
FIG. 24 is a side view of the rapid action engagement interface connection system in accordance with another embodiment.

FIG. 24 is a side view of the rapid action engagement interface connection system in accordance with another embodiment. In FIG. 24, rapid action engagement interface connection system 200' includes modified interchangeable test adaptor 202' to be engaged with modified receiver 212' as described in detail below. Test adaptor 202' includes recessed elongated ribs or grooves 204 used to facilitate the gripping of the test adaptor 202' by a user.

Test adaptor 202' further includes tabs or feet 206' used in the pivoting mechanism of the connection interface system, and guide or fin projections 208' that facilitate the guiding of test adaptor 202' when being connected with receiver 212'. Specifically, tabs 206' are inserted in receiving receptacles or holes 214' creating a pivot along the top of rapid action engagement connection system 200'. Further, guide or fin projections 208' on receiver 212' are inserted in fin grooves 216' in test adaptor 202' as test adaptor 202' becomes engaged with receiver 212'.

Test adaptor 202' further includes locking mechanism 240' which ensures a secure engagement between test adaptor 202' and receiver 212'. Locking mechanism 240' thereby prevents any unexpected and untimely disengagement of the rapid action engagement interface connection system.

Test adaptor 202' includes test adaptor surface contact and/or probe assembly 218 mounted therein as described above using any conventional device/means. Test adaptor surface contact assembly 218 is used to house or accommodate electrical probes and/or contacts, discussed above.

Receiver 212' houses or accommodates receiver module surface contact and/or probe assembly 224 which is connected thereto via standard connection devices. Receiver module surface contact and/or probe assembly 224 is then connectable with a complimentary wiring assembly 292. Cable access tube 228 is provided which shields and protects conductors or cables connected directly between the testing device and test adaptor 202'. Various alternative/modified designs are also considered within the scope of the present invention. For example, guide or fin projections 208' may be formed on test adaptor 202', and fin grooves 216' may be formed on receiver 212'. Similar types of modifications that do not depart from the basic design philosophy of the present invention are also possible.

Similarly, locking mechanism 240' can be replaced with any standard locking mechanism without departing from the spirit and scope of the present invention. However, the design of locking mechanism 240' is also an important element of the present invention and should not be ignored. That is, utilization or inclusion of locking mechanism 240' in combination with the rapid action engagement interface system is also important, although it may be possible to utilize other, less secure locking devices.

Advantageously, rapid action engagement interface connection system 200' has been modified by inverting or reversing the location of the rotational or pivot mechanism 206', 214' with the location of latch mechanism 240'. In addition, guide mechanism 208', 216' has been formed at an upper area of the rapid action engagement interface connection system 200' near the pivot mechanism.

Guide groove 216' is also beneficially formed in interchangeable test adaptor 202', and the guide fins 208' are formed in receiver 212'. Thus, the relatively stationary section of the rapid action engagement interface system 200', receiver 212', includes the guide projections 208', whereas the relatively portable section of the rapid action engagement interface system 200', test adaptor 202', includes the guide grooves 216'.

Significantly, latch or locking mechanism 240' is disposed on the lower part of rapid action engagement interface system 200', further facilitating the secure, fast and simple engagement of the test adaptor 202' with the receiver 212'. That is, locking mechanism 240' is disposed on a convenient area of rapid action engagement interface system 200' since the pivot mechanism 240' has been moved to the upper area of the engagement system 240'.

Pivot mechanism 206', 214' has been designed to facilitate the engagement of test adaptor 202' with receiver 212'. More specifically, the pivot mechanism 216', 214' permits the test adaptor 202' to be easily removed from receiver 212'. In addition, pivot tabs 206' are also advantageously curved or rounded to provide additional surface area for the rotation of pivot tabs 206' about pivot holes 214'. This additional surface area that is created by rounding pivot tabs 206' further enhances the engagement in the rapid action engagement interface system to minimize damage to the pivot mechanism 206', 214'. For example, the rounded surface of pivot tabs 206' provides clearance and stress reduction which minimizes the likelihood that the pivot tabs 206' break when stressed.

Figure 25:
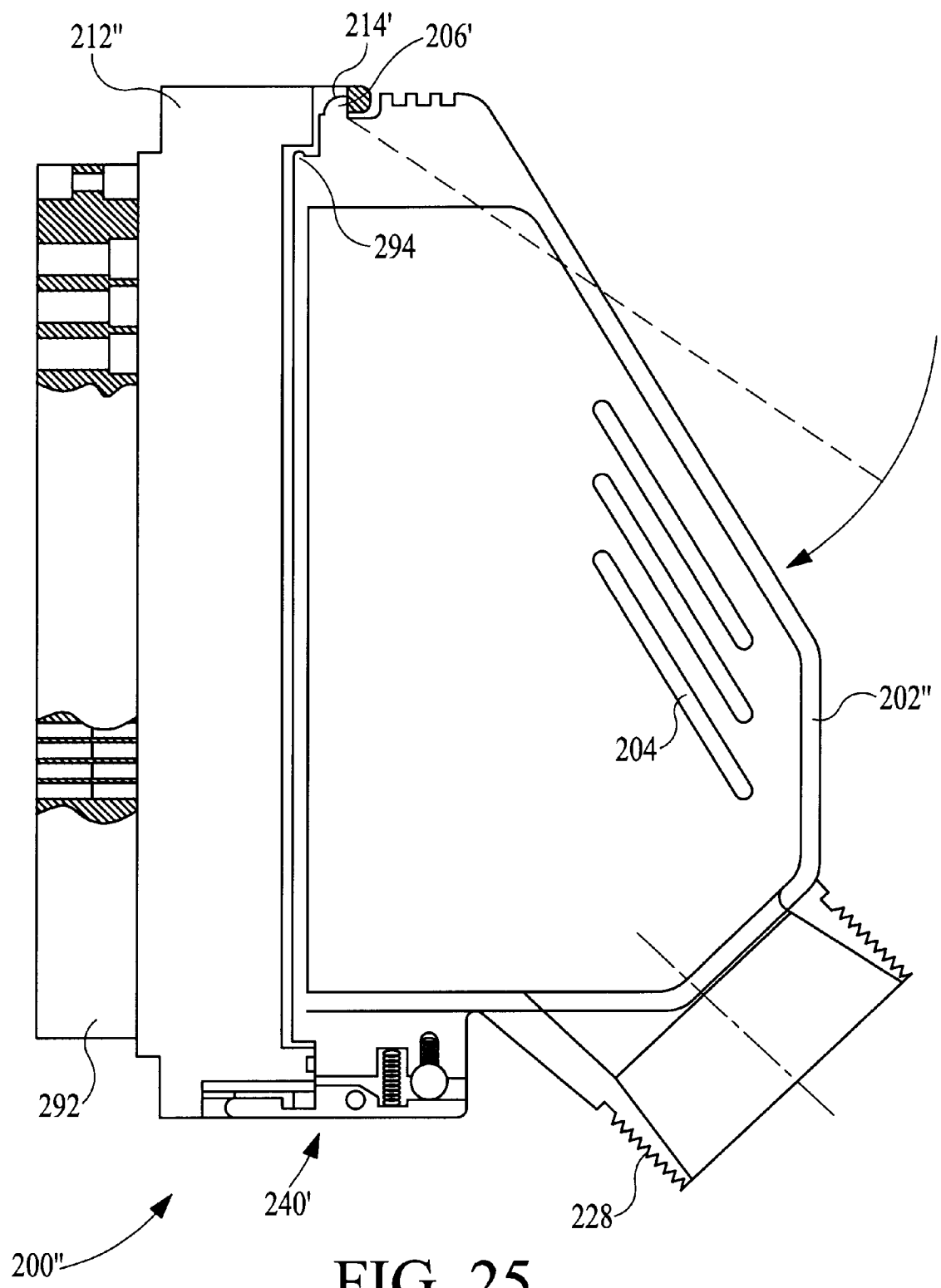
FIG. 25 is a side view of the rapid action engagement interface connection system in accordance with another embodiment.
Figure 25A:
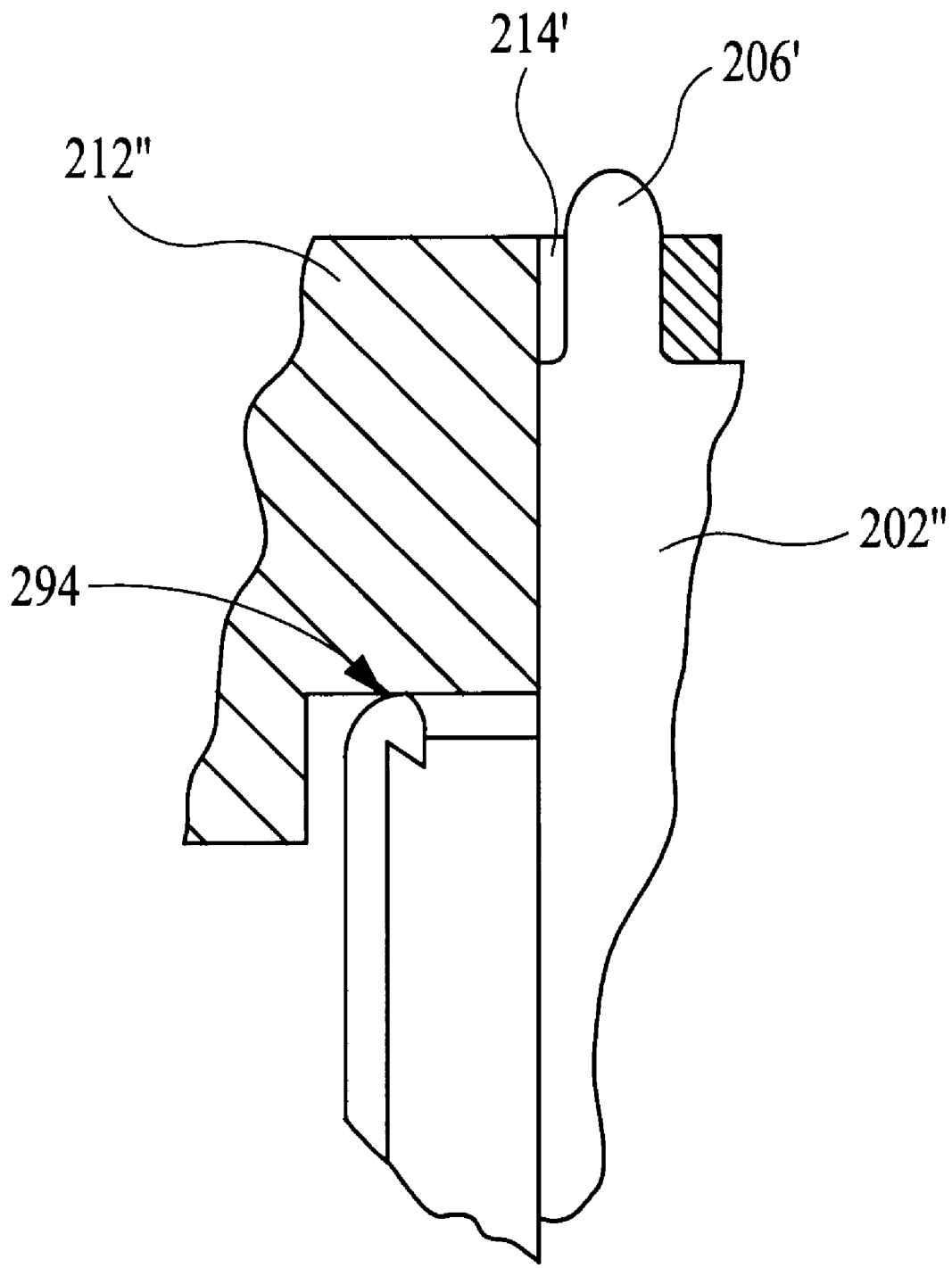
FIG. 25A is an enlarged side view of the pivoting mechanism in the rapid action engagement interface connection system in accordance with another embodiment.

FIG. 25 is a side view of the rapid action engagement interface connection system, and FIG. 25A is an enlarged side view of the pivoting mechanism in the rapid action engagement interface connection system in accordance with another embodiment. In FIGS. 25 and 25A, rapid action engagement interface connection system 200" includes modified interchangeable test adaptor 202" to be engaged with modified receiver 212" as described in detail below. Test adaptor 202" includes recessed elongated ribs or grooves 204 used to facilitate the gripping of the test adaptor 202" by a user.

Test adaptor 202" further includes, integrated or separate, tabs or feet 206' used in the pivoting mechanism of the connection interface system. Specifically, tabs 206' are inserted in receiving receptacles or holes 214' creating a pivot along the top of rapid action engagement connection system 200". Interchangeable test adaptor 202" advantageously includes hinge surface 294 that provides additional or complimentary rotational support, described in more detail below.

Test adaptor 202" further includes locking mechanism 240' which ensures a secure engagement between test adaptor 202" and receiver 212". Locking mechanism 240' thereby prevents any unexpected and untimely disengagement of the rapid action engagement interface connection system.

Test adaptor 202" accommodate one or more test adaptor surface contacts and/or probe assemblies mounted therein as described above using any conventional device/means. The test adaptor surface contact assemblies are used to house or accommodate electrical probes and/or contacts, discussed above.

Receiver 212" houses or accommodates one or more receiver module surface contacts and/or probe assemblies which are connected thereto via standard connection devices. Receiver module surface contacts and/or probe assemblies are then connectable with a complimentary wiring assembly 292. Cable access tube 228 is provided which shields and protects conductors or cables connected directly between the testing device and test adaptor 202". Various alternative/modified designs are also considered within the scope of the present invention. For example, locking mechanism 240' can be replaced with any standard locking mechanism without departing from the spirit and scope of the present invention.

Figure 26C:
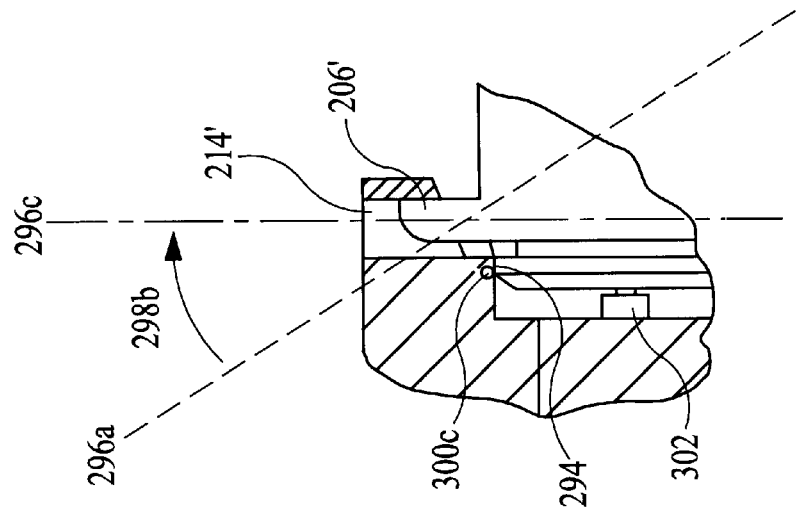
FIGS. 26A–26C are sequential side views of the pivoting mechanism in the rapid action engagement interface connection system as the interchangeable test adaptor engages the receiver.
Figure 26B:
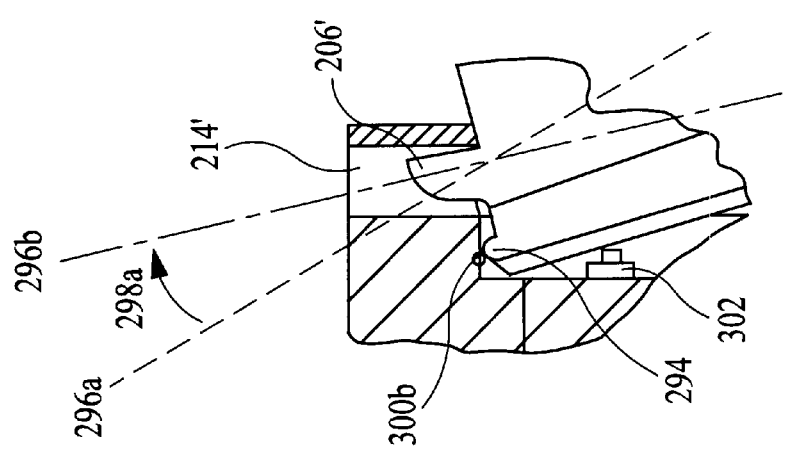
Figure 26A:
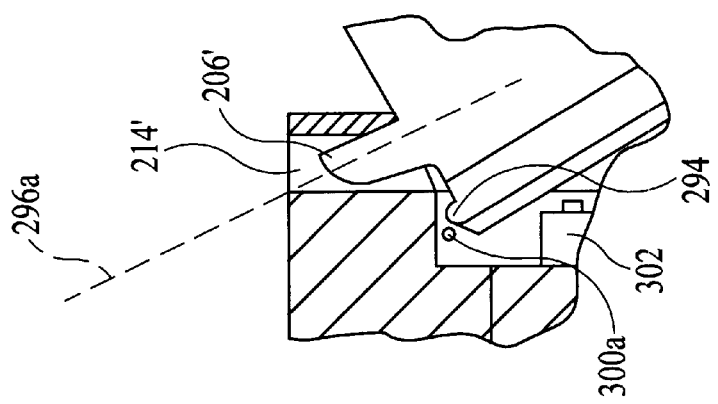

FIGS. 26A–26C are sequential side views of the pivoting mechanism in the rapid action engagement interface connection system as the interchangeable test adaptor engages the receiver. Interchangeable test adaptor 202" includes a hinge surface 294 that provides additional or complimentary rotational support. In FIG. 26A, the pivot tab 206' is oriented in accordance with a first position 296a in pivot receptacle 214'. Hinge surface 294 does not initially engage the receiver when pivot tab 206' is inserted in receptacle 214' as is seen in location 300a. Connector 302 on the receiver has not been engaged or in contact with the interchangeable test adaptor for electrical and mechanical connection. This rotational joint significantly minimizes the centerline misalignment during the engagement cycle.

In FIG. 26B, the interchangeable test adaptor has been rotated toward the direction of engagement, and the pivot tab 206' is oriented in accordance with a second position 296b in pivot receptacle 214', creating a first angular displacement 298a. At this point of the engagement, hinge surface 294 engages the receiver when pivot tab 206' is rotated in receptacle 214' as is seen in location 300b. The use of hinge surface 294 provides an additional rotational joint at location 300b for pivoting the interchangeable test adaptor into the receiver. This additional rotational joint removes or transfers some stress from rotational joint or pivot tabs 206', thereby providing a longer life for the rapid action engagement interface connection system. At this point of the engagement, connector 302 has begun to be depressed or in contact with the interchangeable test adaptor.

In FIG. 26C, the interchangeable test adaptor is engaged, and the pivot tab 206' is oriented in accordance with a third position 296c in pivot receptacle 214', creating a second angular displacement 298b. At this point of the engagement, hinge surface 294 completely engages the receiver when pivot tab 206' is rotated in receptacle 214' as is seen in location 300c. The use of hinge surface 294 provides an additional rotational joint at location 300c for pivoting the interchangeable test adaptor into the receiver. At this point of the engagement, connector 302 has been fully depressed or in contact with the interchangeable test adaptor.

Advantageously, the pivot mechanism 206', 214' has been designed to facilitate the engagement of test adaptor 202" with receiver 212". More specifically, the pivot mechanism 216', 214' permits the test adaptor 202' to be easily removed from receiver 212'. In addition, pivot tabs 206' are also advantageously curved or rounded to provide additional surface area for the rotation of pivot tabs 206' about pivot holes 214'. This additional surface area that is created by rounding pivot tabs 206' further enhances the engagement in the rapid action engagement interface system to minimize damage to the pivot mechanism 206', 214'. In addition, interchangeable test adaptor 202" advantageously includes hinge surface 294 that provides additional or complimentary rotational support.

EVALUATION OF RAPID ACTION INTERFACE ENGAGEMENT MECHANISM

We have evaluated the design of the rapid action engagement interface connection system illustrated in FIGS. 25–26C, and achieved the following results: The purpose of this test was to establish mechanical life of the rapid action interface engagement mechanism (CLICK) illustrated in FIGS. 25–26C, and the effect of angular engagement on the COAX TAC.

Test Sample
  Click Receiver/ITA fully loaded:
  # Component
(1) Receiver Wiring Module 220/24 P/N 510130162
(2) Receiver Tac Module 220/24 P/N 510130121
(1) ITA Wiring Module 220/24 P/N 510103139
(220) STAC P/N 610122101
(440) Signal Surface Contacts P/N 610127110
(12) PTAC P/N 610135101
(24) Power Surface Contacts P/N 610136101
(12) CTAC P/N 610133101
(24) Coax Surface Contacts P/N 410115108
(1) Click Top P/N 410115108
(1) Click Bottom P/N 310117115
Test Equipment
  Pneumatic engaging mechanism
  Vector Network Analyzer Hewlett Packard 8720C
  Microscope
Test Procedure
  Cycle the CLICK mechanism using the pneumatic engaging system. Every predetermined number of cycles, remove the CLICK and check for wear in all critical areas and perform standard VSWR testing on the coax contacts for degradation.
Test Results
Jun. 25, 1996
  CLICK Life Test using new design to eliminate wear on coax center conductor and side edge of top housing.
  0 Cycles—Inspected and recorded dimensions to establish references to wear.
  527 Cycles—No noticeable wear on center conductor. Polishing of sand blasted surface on side edge of top—little more polish on one side vs. opposite side.
  1000 Cycles—Same as @ 527 cycles.
  1500 Cycles—Same as @ 527 cycles, also noted polishing and black marks on bottom half where rotation of top takes place.
Jun. 26, 1996
  2000 Cycles—Same as 1500 cycles.
  4000 Cycles—Slight increase in wear at rotation line. All the others are the same. No noticeable wear on coax contacts.
Jun. 27, 1996
  6000 Cycles—Rotation line wear remains the same. Three measurements showed 4.470. Checked coax contacts for wear under microscope. No indication of wear only polishing of surfaces.
Jun. 28, 1996
  8000 Cycles—Nothing has changed in regard to wear.
Jul. 1, 1996
  12,000 Cycles—Increased black residue (from aluminum polishing) in wear areas. Rotation line is now all the way across on mating surface. Micrometer readings shows no wear. Microscopic viewing of coax contact surfaces shows only polishing.
2, 1996
  20,000 Cycles—Increased amount of black residue in cavity near the TAC module. Some residue (very slight) is on the bottom of the TAC contact—right side. Very small amount of gold dust is noticeable on insulator of COAX TAC pin. No wear on contacts—just a polishing of surfaces. Some horizontal sliding is noticeable on power pins approximately 0.005. The dimension for the rotation plane is still at 4.740.
  22,500 Cycles—No changes from 20,000 cycles starting to get extra wear on left side of top extension where it goes into the bottom half.
3, 1996
  25,106 Cycles—More wear on left side creating some alum dust. The critical dimension to rotation line is still the same. Inspected the contacts for wear and they show no indications of significant wear.
  30,240 Cycles—No noticeable or measurable changes from 25,000 cycles.
Opinion
  This design works and meets the criteria as specified mechanically.
Observation
  COAX TAC showed little to no wear. Electrical testing of COAX TAC showed no degradation over 25,000 cycles.

As clearly shown, the rapid action engagement connection interface system firmly and evenly forces the electrical contacts of the interchangeable test adaptor into engagement with the contacts of the receiver in a precisely guided, and repetitive manner. Further, a lateral or transversal wiping action is beneficially provided, further enhancing electrical contact between contact surfaces.

Although the present invention has been described and illustrated in detail, it is clearly understood that the same is by way of illustration and example only and is not to be taken by way of limitation, the spirit and scope of the present invention being limited only by the terms of the appended claims.

While there have been described and illustrated several specific embodiments of the invention, it will be clear that variations in the details of the embodiments specifically illustrated and described may be made without departing from the true spirit and scope of the invention as defined in the appended claims. For example, the locations of the latch mechanism and the pivot mechanism may be alternated to be on opposite sides of the rapid action engagement connection system. Similarly, other types of pivot mechanisms may be used that permit easy separation between the receiver and the interchangeable test adaptor.

What is claimed is:

1. A rapid action engagement interface connection system for positioning and electrically connecting a testing device to a device under test for the testing device to exercise and test the device under test, said rapid action engagement interface connection system comprising:

a receiver electrically connected to the testing device and including at least one receiver electrical connector, said receiver including:
  a receiver main body section accommodating said at least one receiver electrical connector, said receiver main body having upper and lower receiver sections and first and second receiver sides;
  a pivot tab, connected to, or integral with, the lower receiver section of said receiver main body section and comprising a substantially straight, flat and vertical projection relative to an enaaaement direction of the rapid action enaaaement interface connection system;
  first and second fin-shaped guides, connected to, or integral with, the first and second receiver sides, respectively; and
  a locking latch mechanism disposed on the upper receiver section of said receiver main body section; and
an interchangeable test adaptor electrically connected to the device under test, removably couplable to said receiver and including at least one test electrical connector, said interchangeable test adaptor including:
  a test main body section accommodating said at least one test electrical connector, said test main body having upper and lower test sections and first and second test sides;
  a pivot tab receiver comprising an aperture, connected to, or integral with, the lower test section of said test main body section;
  first and second fin-shaped grooves, formed in, or integral with, the first and second test sides, respectively; and
  a locking latch receiver disposed on the upper test section of said test main body section,
wherein when said pivot tab engages and is inserted in said pivot tab receiver, said receiver is pivotally engagable with said interchangeable test adaptor, and said receiver is pivotally guided into engagement with said interchangeable test adaptor utilizing said first and second fin-shaped guides that are introduced into said first and second fin-shaped grooves respectively, and said receiver is secured to said interchangeable test adaptor utilizing said locking latch mechanism and said locking latch receiver.

2. A rapid action engagement interface connection system according to claim 1, wherein the at least one test electrical connector comprises a printed circuit board engagable with the at least one receiver electrical connector.

3. A rapid action engagement interface connection system according to claim 2, wherein the at least one test electrical connector further comprises another printed circuit board engagable with another receiver electrical connector.

4. A rapid action engagement interface connection system according to claim 3, wherein the printed circuit board comprises a first device under test, and the another printed circuit board comprises a second device under test.

5. A rapid action engagement interface connection system according to claim 1, wherein the at least one receiver electrical connector is connectable with at least one of a printed circuit board and a discrete electrical connector engagable with the testing device.

6. A rapid action engagement interface connection system according to claim 5, wherein the at least one receiver electrical connector is connectable with at least one of another printed circuit board and another discrete electrical connector engagable with the testing device.

7. A rapid action engagement interface connection system according to claim 5, wherein the at least one test electrical connector comprises at least one of another printed circuit board and another discrete electrical connector engagable with the testing device.

8. A rapid action engagement interface connection system according to claim 7, wherein the printed circuit board is electrically connected to the at least one of another printed circuit board and another discrete electrical connector.

9. A rapid action engagement interface connection system according to claim 7, wherein the another printed circuit board is electrically connected to the at least one of printed circuit board and discrete electrical connector.

10. A rapid action engagement interface connection system according to claim 1, wherein the at least one test electrical connector comprises at least one of a printed circuit board and a discrete electrical connector engagable with the device under test.

11. A rapid action engagement interface connection system according to claim 1, wherein said receiver main body section includes at least one elongated groove on each of said first and second receiver sides, for enhanced gripping.

12. A rapid action engagement interface connection system according to claim 1, wherein said locking latch mechanism comprises:
  a pivotable latch that is biased in the closed position;
  a first bias device biasing the pivotable latch in the engaged position;
  a locking cylinder including a locking groove, an unlocking groove and a joining groove disposed therebetween;
  a cylinder engagement device engagable with the locking cylinder so that the locking cylinder locks said locking latch mechanism by engaging in one of the locking and unlocking grooves; and
  a second bias device biasing the cylinder engagement device into the one of the locking and unlocking grooves,
  wherein the pivoting latch is in the locked position when the locking cylinder is positioned in the locking groove, and the pivotable latch is in the unlocked position when the locking cylinder is positioned in the unlocking groove.

13. A rapid action engagement interface connection system according to claim 1, wherein said interchangeable test adaptor further comprises a test adaptor assembly, and said test adaptor assembly accommodates the at least one test electrical connector to facilitate connection between the device under test and the rapid action engagement interface connection system, said test adaptor assembly removably connectable to said interchangeable test adaptor facilitating the connection and removal of a plurality of test adaptor assemblies with a plurality of test electrical connectors.

14. A rapid action engagement interface connection system according to claim 13, wherein said receiver further comprises a receiver module assembly, and said receiver module assembly accommodates the at least one receiver electrical connector to facilitate connection between the testing device and the rapid action engagement interface connection system, said receiver module assembly removably connectable to said receiver facilitating the connection and removal of a plurality of receiver module assemblies with a plurality of receiver electrical connectors.

15. A rapid action engagement interface connection system according to claim 14, wherein said receiver is pivotally guided into engagement with said interchangeable test adaptor, thereby engaging the receiver module assembly and the at least one receiver electrical connector accommodated therein with the test adaptor module assembly and the at least one test electrical connector accommodated therein.

16. A rapid action engagement interface connection system for positioning and electrically connecting a testing device to a device under test for the testing device to exercise and test the device under test, said rapid action engagement interface connection system comprising:

a receiver electrically connected to the testing device and including at least one receiver electrical connector, said receiver including:

a receiver main body section accommodating said at least one receiver electrical connector, said receiver main body having upper and lower receiver sections and first and second receiver sides;

a pivot tab, connected to, or integral with, the lower receiver section of said receiver main body section and comprising a substantially straight, flat and vertical projection relative to an engagement direction of the rapid action engagement interface connection system;

first and second guide receivers, connected to, or integral with, the first and second receiver sides, respectively; and a locking latch mechanism disposed on the upper receiver section of said receiver main body section; and an interchangeable test adaptor electrically connected to the device under test, removably couplable to said receiver and including at least one test electrical connector, said interchangeable test adaptor including:

a test main body section accommodating said at least one test electrical connector, said test main body having upper and lower test sections and first and second test sides;

a pivot tab receiver comprising an aperture, said pivot tab engaging with and inserted in said pivot tab receiver, connected to, or integral with, the lower test section of said test main body section;

first and second guides, connected to, or integral with, the first and second test sides, respectively; and a locking latch receiver disposed on the upper test section of said test main body section.

17. A method of positioning and engaging a test electrical connector with a receiver electrical connector using a rapid action engagement interface connection system comprising an interchangeable test adaptor pivotally engagable with a receiver, the interchangeable test adaptor lockable with the receiver after engagement, said method comprising the steps of:

(a) mounting the test electrical connector to the interchangeable test adaptor;

(b) mounting the receiver electrical connector to the receiver;

(c) engaging a pivot tab of the receiver in a pivot tab receiver of the interchangeable test adaptor;

(d) pivotally guiding and engaging the interchangeable test adaptor with the receiver via the engagement of the pivot tab and the pivot tab receiver, thereby engaging the test electrical connector to the receiver electrical connector; and (e) locking the interchangeable test adaptor with the receiver via a locking mechanism.

18. A method of positioning and engaging a test electrical connector with a receiver electrical connector using a rapid action engagement interface connection system comprising an interchangeable test adaptor separate from and pivotally engagable with a receiver, the interchangeable test adaptor lockable with the receiver after engagement, said method comprising the steps of:

(a) mounting the test electrical connector to the interchangeable test adaptor;

(b) mounting the receiver electrical connector to the receiver, the receiver separate from and pivotally engagable with the interchangeable test adaptor;

(c) engaging the receiver to the interchangeable test adaptor using a separatable pivot mechanism providing the ability to expediently and sequentially engage multiple interchangeable test adaptors to the receiver;

(d) pivotally guiding and engaging the interchangeable test adaptor with the receiver via the separatable pivot mechanism, thereby engaging the test electrical connector to the receiver electrical connector.

19. A rapid action engagement interface connection system for positioning and electrically connecting a testing device to a device under test for the testing device to exercise and test the device under test, said rapid action engagement interface connection system comprising:

a receiver electrically connected to the testing device and including a receiver module assembly accommodating at least one receiver electrical connector, said receiver module assembly facilitating connection between the testing device and said receiver, said receiver module assembly removably connectable to said receiver facilitating the connection and removal of a plurality of receiver module assemblies with a plurality of receiver electrical connectors;

an interchangeable test adaptor electrically connected to the device under test, and removably couplable to said receiver, said interchangeable test adaptor including a test adaptor assembly accommodating at least one test electrical connector, said test adaptor assembly facilitating connection between the device under test and said interchangeable test adaptor, said test adaptor assembly removably connectable to said interchangeable test adaptor, facilitating the connection and removal of a plurality of test adaptor assemblies with a plurality of test electrical connectors;

a separatable pivot mechanism enabling said receiver to be separated and completely removed from said interchangeable test adaptor and providing the ability to expediently and sequentially engage multiple interchangeable test adaptors to said receiver, said pivot mechanism pivotably engaging said receiver with said interchangeable test adaptor, thereby engaging the at least one test electrical connector with the at least one receiver electrical connector.

20. A rapid action engagement interface connection system for positioning and electrically connecting a testing device to a device under test for the testing device to exercise and test the device under test, said rapid action engagement interface connection system comprising:

a receiver electrically connected to the testing device and including a receiver module assembly accommodating at least one receiver electrical connector, said receiver module assembly facilitating connection between the testing device and said receiver, said receiver module assembly removably connectable to said receiver facilitating the connection and removal of a plurality of receiver module assemblies with a plurality of receiver electrical connectors;

an interchangeable test adaptor electrically connected to the device under test, and removably couplable to said receiver, said interchangeable test adaptor including a test adaptor assembly accommodating at least one test electrical connector, said test adaptor assembly facilitating connection between the device under test and said interchangeable test adaptor, said test adaptor assembly removably connectable to said interchangeable test adaptor facilitating the connection and removal of a plurality of test adaptor assemblies with a plurality of test electrical connectors;

pivot means for enabling said receiver to be separated and completely removed from said interchangeable test adaptor and providing the ability to expediently and sequentially engage multiple interchangeable test adaptors to said receiver, said pivot means for pivotably engaging said receiver with said interchangeable test adaptor, thereby engaging the at least one test electrical connector with the at least one receiver electrical connector.

21. A method of positioning and engaging a test electrical connector with a receiver electrical connector using a rapid action engagement interface connection system comprising an interchangeable test adaptor separate from and pivotally engagable with a receiver, the interchangeable test adaptor lockable with the receiver after engagement, said method comprising the steps of:

(a) mounting the test electrical connector to the interchangeable test adaptor;

(b) mounting the receiver electrical connector to the receiver, the receiver separate from and pivotally engagable with the interchangeable test adaptor;

(c) providing a separatable pivot mechanism at an upper end of the receiver and the interchangeable test adaptor, the separatable pivot mechanism expediently and sequentially engaging the interchangeable test adaptor to the receiver;

(d) engaging the receiver to the interchangeable test adaptor using the separatable pivot mechanism;

(e) pivotally guiding downward and engaging the interchangeable test adaptor with the receiver via the separatable pivot mechanism, thereby engaging the test electrical connector to the receiver electrical connector.

22. A rapid action engagement interface connection system for positioning and electrically connecting a testing device to a device under test for the testing device to exercise and test the device under test, said rapid action engagement interface connection system comprising:

a receiver electrically connected to the testing device and including a receiver module assembly accommodating at least one receiver electrical connector, said receiver module assembly facilitating connection between the testing device and said receiver, said receiver module assembly removably connectable to said receiver facilitating the connection and removal of a plurality of receiver module assemblies with a plurality of receiver electrical connectors;

an interchangeable test adaptor electrically connected to the device under test, and removably couplable to said receiver, said interchangeable test adaptor including a test adaptor assembly accommodating at least one test electrical connector, said test adaptor assembly facilitating connection between the device under test and said interchangeable test adaptor, said test adaptor assembly removably connectable to said interchangeable test adaptor facilitating the connection and removal of a plurality of test adaptor assemblies with a plurality of test electrical connectors;

a separatable pivot mechanism disposed on an upper end of said receiver and said interchangeable test adaptor, said separatable pivot mechanism enabling said receiver to be separated and completely removed from said interchangeable test adaptor and providing the ability to expediently and sequentially engage the interchangeable test adaptor to said receiver, said pivot mechanism pivotably engaging downward said receiver with said interchangeable test adaptor, thereby engaging the at least one test electrical connector with the at least one receiver electrical connector.

23. A rapid action engagement interface connection system for positioning and electrically connecting a testing device to a device under test for the testing device to exercise and test the device under test, said rapid action engagement interface connection system comprising:

a receiver electrically connected to the testing device and including a receiver module assembly accommodating at least one receiver electrical connector, said receiver module assembly facilitating connection between the testing device and said receiver, said receiver module assembly removably connectable to said receiver facilitating the connection and removal of a plurality of receiver module assemblies with a plurality of receiver electrical connectors;

an interchangeable test adaptor electrically connected to the device under test via a cable, and removably couplable to said receiver, said interchangeable test adaptor including a test adaptor assembly accommodating at least one test electrical connector, said test adaptor assembly facilitating connection between the device under test and said interchangeable test adaptor, said test adaptor assembly removably connectable to said interchangeable test adaptor facilitating the connection and removal of a plurality of test adaptor assemblies with a plurality of test electrical connectors;

pivot means for enabling said receiver to be separated and completely removed from said interchangeable test adaptor and providing the ability to expediently and sequentially engage multiple interchangeable test adaptors to said receiver, said pivot means for pivotably engaging downward said receiver with said interchangeable test adaptor using the cable and mass associated therewith to enhance a force moment rotating about said pivot means.

24. A rapid action engagement interface connection system according to claim 23, further comprising a locking mechanism disposed on a lower area of the rapid action engagement interface connection system, said locking mechanism including a locking latch receiver disposed on a lower section of at least one of said receiver and said interchangeable test adaptor, and a locking latch mechanism disposed on a lower section of another of said receiver and said interchangeable test adaptor, and wherein said locking mechanism facilitates the secure, fast and simple engagement of said interchangeable test adaptor with said receiver.

25. A rapid action engagement interface connection system according to claim 23, further comprising a guide mechanism disposed on the rapid action engagement interface connection system, said guide mechanism including first and second grooves on opposite sides of said interchangeable test adaptor being a relatively portable part of the rapid action engagement interface connection system, and first and second guides on opposite sides of said receiver being a relatively stationary part of the rapid action engagement interface connection system, thereby minimizing damage to said guide mechanism.

26. A rapid action engagement interface connection system according to claim 23, wherein said pivot means comprises:

pivot projection on an upper section of either said receiver or said interchangeable test adaptor, said pivot projection comprising a substantially straight, flat and vertical projection relative to an engagement direction of the rapid action engagement interface connection system; and a pivot tab receiver on an upper section of the other of said receiver or said interchangeable test adaptor, said pivot tab receiver comprising an aperture, said pivot tab engaging with and inserted in said pivot tab receiver.

27. A rapid action engagement interface connection system according to claim 26, wherein said pivot projection is further rounded on an engagement surface of said pivot projection to provide additional clearance area for the rotation of said pivot projection about said pivot tab receiver, thereby minimizing damage to said pivot means.

28. A rapid action engagement interface connection system according to claim 26, wherein said interchangeable test adaptor further comprises a hinge surface providing additional hinge support for said pivot means and said pivot projection, thereby minimizing stress associated with engagement of the rapid action engagement interface connection system.

29. A rapid action engagement interface connection system according to claim 23, wherein said interchangeable test adaptor further comprises a hinge surface providing additional hinge support for said pivot means.

30. A rapid action engagement interface connection system according to claim 29, wherein said hinge surface engages said receiver to provide additional hinge support for said pivot means.

31. A rapid action engagement interface connection system according to claim 29, wherein said hinge surface engages said receiver to provide additional hinge support for said pivot means and minimizes a centerline misalignment of the rapid action engagement interface connection system during an engagement cycle.

32. A rapid action engagement interface connection system according to claim 30, wherein said hinge surface engages said receiver as substantially the same time that said interchangeable test adaptor contacts the at least one receiver electrical connector.

\* \* \* \* \*